United States Patent
Kumar et al.

(10) Patent No.: US 10,778,143 B2
(45) Date of Patent: Sep. 15, 2020

(54) TECHNIQUES AND APPARATUSES FOR MITIGATING VOLTAGE CONTROLLED OSCILLATOR FREQUENCY DISTURBANCE

(71) Applicant: QUALCOMM Incorporated, San Diego, CA (US)

(72) Inventors: Akash Kumar, Hyderabad (IN); Raveesh Juneja, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 111 days.

(21) Appl. No.: 15/704,769

(22) Filed: Sep. 14, 2017

(65) Prior Publication Data

US 2019/0081594 A1    Mar. 14, 2019

(51) Int. Cl.
| | |
|---|---|
| *H03B 1/04* | (2006.01) |
| *H04L 5/14* | (2006.01) |
| *H04W 84/04* | (2009.01) |
| *H04W 84/12* | (2009.01) |
| *H04W 88/02* | (2009.01) |

(52) U.S. Cl.
CPC .............. *H03B 1/04* (2013.01); *H04L 5/14* (2013.01); *H03B 2200/009* (2013.01); *H04W 84/042* (2013.01); *H04W 84/12* (2013.01); *H04W 88/02* (2013.01)

(58) Field of Classification Search
CPC .......... H03B 1/04; H04L 5/14; H04W 84/042; H04W 84/12; H04W 88/02
See application file for complete search history.

(56) References Cited

U.S. PATENT DOCUMENTS

| | | | | |
|---|---|---|---|---|
| 6,434,187 | B1 * | 8/2002 | Beard .................... | H04B 1/403 332/128 |
| 6,594,273 | B1 * | 7/2003 | McGibney ............ | H04W 88/04 370/336 |
| 7,697,895 | B2 * | 4/2010 | Grundvig .............. | H04W 28/18 455/113 |
| 8,699,631 | B2 * | 4/2014 | Kravets ................ | H04B 1/1027 375/340 |
| 8,743,748 | B2 * | 6/2014 | Pan .................... | H04W 56/0045 370/280 |
| 9,143,085 | B2 * | 9/2015 | Narathong ............. | H04B 1/408 |
| 9,246,435 | B1 * | 1/2016 | Kavousian ............... | H03B 5/06 |

(Continued)

FOREIGN PATENT DOCUMENTS

WO    WO-2014204706 A2    12/2014

*Primary Examiner* — Huy D Vu
*Assistant Examiner* — Bailor C. Hsu
(74) *Attorney, Agent, or Firm* — QUALCOMM Incorporated

(57) ABSTRACT

Certain aspects of the present disclosure generally relate to wireless communication. In some aspects, a user equipment may tune a first voltage controlled oscillator (VCO) to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier; and communicate, while the first VCO is tuned to the offset frequency, a communication associated with a second VCO, wherein the second is tuned to the particular frequency. Numerous other aspects are provided.

30 Claims, 11 Drawing Sheets

900 ⟶

910 ⟶ Tune a first VCO to an offset frequency from a particular frequency, wherein the offset frequency differs from the particular frequency by an offset, wherein the offset is based at least in part on at least one parameter, and wherein a UE is configured to operate in an at least one carrier mode associated with at least one time division duplexed carrier 920 ⟶ Communicate, while the first VCO is tuned to the offset frequency, a communication associated with a second VCO, wherein the second VCO is tuned to the particular frequency

(56) References Cited

U.S. PATENT DOCUMENTS

| | | | |
|---|---|---|---|
| 9,356,606 B2* | 5/2016 | Caffee | H03L 7/02 |
| 9,628,308 B2 | 4/2017 | Muhammad et al. | |
| 9,647,862 B2* | 5/2017 | Park | H04L 27/2601 |
| 2004/0125869 A1* | 7/2004 | May | H04B 1/40 |
| | | | 375/219 |
| 2007/0133611 A1* | 6/2007 | Li | H04L 27/0014 |
| | | | 370/503 |
| 2010/0056069 A1* | 3/2010 | Toshimitsu | H04B 1/38 |
| | | | 455/75 |
| 2010/0315138 A1* | 12/2010 | Namba | H03L 1/026 |
| | | | 327/157 |
| 2010/0323635 A1 | 12/2010 | Steeper et al. | |
| 2013/0116004 A1* | 5/2013 | Haralabidis | G01R 23/02 |
| | | | 455/550.1 |
| 2015/0016428 A1* | 1/2015 | Narasimha | H04L 5/0058 |
| | | | 370/336 |
| 2015/0092683 A1 | 4/2015 | Rangarajan et al. | |

* cited by examiner

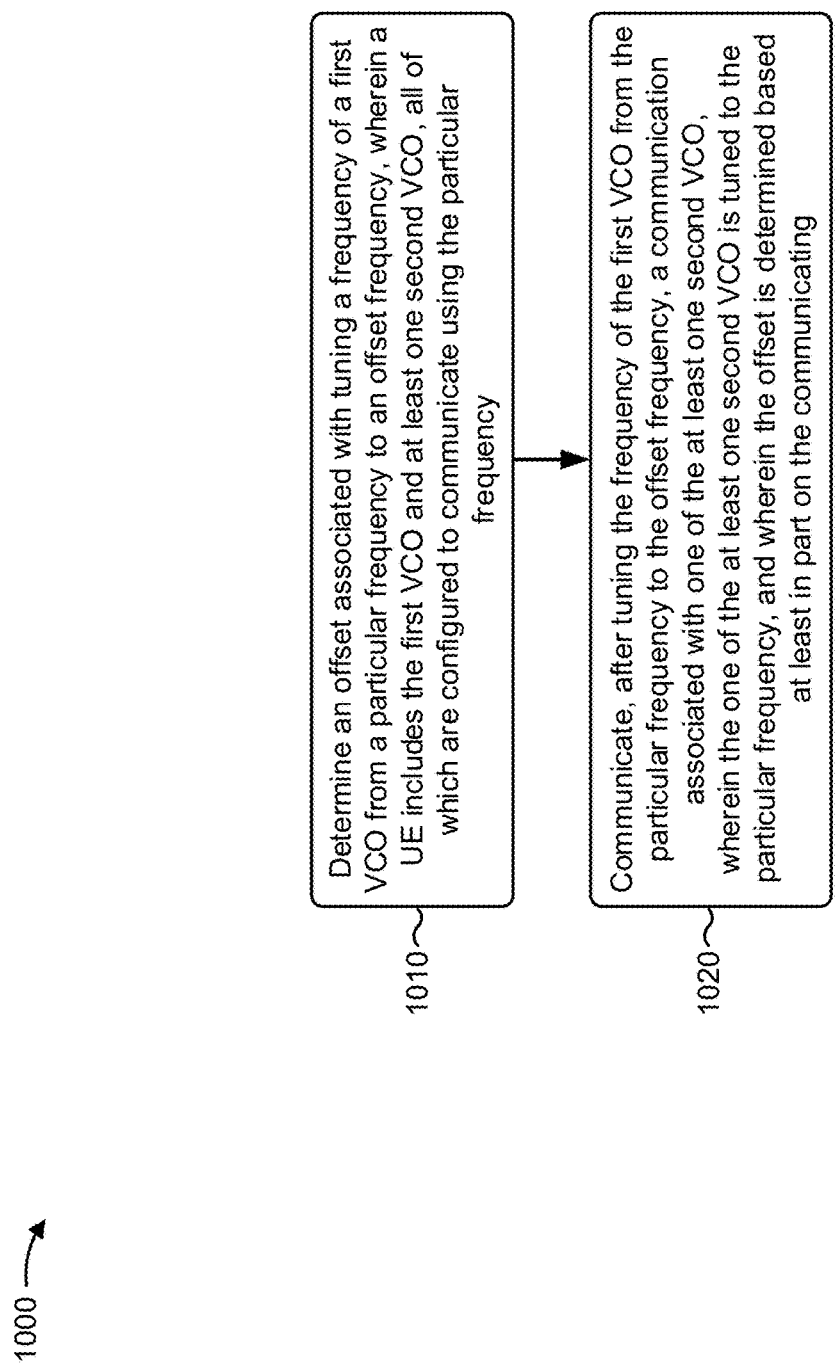

TECHNIQUES AND APPARATUSES FOR MITIGATING VOLTAGE CONTROLLED OSCILLATOR FREQUENCY DISTURBANCE

FIELD OF THE DISCLOSURE

Aspects of the present disclosure generally relate to wireless communication, and more particularly to techniques and apparatuses for mitigating voltage controlled oscillator frequency disturbance.

BACKGROUND

Wireless communication systems are widely deployed to provide various telecommunication services, such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, a national, a regional, and even a global level. An example of a telecommunication standard is Long Term Evolution (LTE). LTE is a set of enhancements to the Universal Mobile Telecommunications System (UMTS) mobile standard promulgated by Third Generation Partnership Project (3GPP). LTE is designed to better support mobile broadband Internet access by improving spectral efficiency, lowering costs, improving services, using new spectrum, and integrating with other open standards using OFDMA on the downlink (DL), SC-FDMA on the uplink (UL), and multiple-input multiple-output (MIMO) antenna technology.

SUMMARY

In some aspects, a method of wireless communication may include tuning, by a user equipment (UE), a first voltage controlled oscillator (VCO) to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier; and communicating, by the UE and while the first VCO is tuned to the offset frequency, a communication associated with a second VCO, wherein the second VCO is tuned to the particular frequency.

In some aspects, a UE may include a memory and one or more processors operatively coupled to the memory. The one or more processors may be configured to tune a first VCO to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier; and communicate, while the first VCO is tuned to the offset frequency, a communication associated with a second VCO, wherein the second VCO is tuned to the particular frequency.

In some aspects, a non-transitory computer-readable medium may store one or more instructions for wireless communication. The one or more instructions, when executed by one or more processors of a UE, may cause the one or more processors to tune a first VCO to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier; and communicate, while the first VCO is tuned to the offset frequency, a communication associated with a second VCO, wherein the second VCO is tuned to the particular frequency.

In some aspects, an apparatus for wireless communication may include means for tuning a first VCO to an offset frequency from a particular frequency, wherein the offset frequency differs from the particular frequency by an offset, wherein the offset is based at least in part on at least one parameter, and wherein the apparatus is configured to operate in an at least one carrier mode associated with at least one time division duplexed carrier; and means for communicating, while the first VCO is tuned to the offset frequency, a communication associated with a second VCO, wherein the second VCO is tuned to the particular frequency.

In some aspects, a method of wireless communication may include determining, by a UE, an offset associated with tuning a frequency of a first VCO from a particular frequency to an offset frequency, wherein the UE includes the first VCO and at least a second VCO, all of which are configured to communicate using the particular frequency, and wherein the UE is configured to operate in an at least one carrier mode associated with at least one time division duplexed carrier; and communicating, by the UE and after tuning the frequency of the first VCO from the particular frequency to the offset frequency, a communication associated with one of the at least the second VCO, wherein the one of the at least the second VCO is tuned to the particular frequency, and wherein the offset is determined based at least in part on the communicating.

In some aspects, a UE may include a memory and one or more processors operatively coupled to the memory. The one or more processors may be configured to determine an offset associated with tuning a frequency of a first VCO from a particular frequency to an offset frequency, wherein the UE includes the first VCO and at least a second VCO, all of which are configured to communicate using the particular frequency, and wherein the UE is configured to operate in an at least one carrier mode associated with at least one time division duplexed carrier; and communicate, after tuning the frequency of the first VCO from the particular frequency to the offset frequency, a communication associated with one of the at least the second VCO, wherein the one of the at least the second VCO is tuned to the particular frequency, and wherein the offset is determined based at least in part on the communicating.

In some aspects, a non-transitory computer-readable medium may store one or more instructions for wireless communication. The one or more instructions, when executed by one or more processors of a UE, may cause the one or more processors to determine an offset associated with tuning a frequency of a first VCO from a particular frequency to an offset frequency, wherein the UE includes the first VCO and at least a second VCO, all of which are configured to communicate using the particular frequency, and wherein the UE is configured to operate in an at least one carrier mode associated with at least one time division duplexed carrier; and communicate, after tuning the frequency of the first VCO from the particular frequency to the offset frequency, a communication associated with one of the at least the second VCO, wherein the one of the at least the second VCO is tuned to the particular frequency, and wherein the offset is determined based at least in part on the communicating.

In some aspects, an apparatus for wireless communication may include means for determining an offset associated with tuning a frequency of a first VCO from a particular frequency to an offset frequency, wherein the apparatus includes the first VCO and at least a second VCO, all of which are configured to communicate using the particular frequency, and wherein the apparatus is configured to operate in an at least one carrier mode associated with at least one time division duplexed carrier; and means for communicating, after tuning the frequency of the first VCO from the particular frequency to the offset frequency, a communication associated with one of the at least the second VCO, wherein the one of the at least the second VCO is tuned to the particular frequency, and wherein the offset is determined based at least in part on the communicating.

Aspects generally include a method, apparatus, system, computer program product, non-transitory computer-readable medium, user equipment, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIG. 10 is a diagram illustrating an example process performed, for example, by a user equipment, in accordance with various aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for providing a thorough understanding of the various concepts. However, it will be apparent to those skilled in the art that these concepts may be practiced without these specific details.

The techniques described herein may be used for one or more of various wireless communication networks such as code division multiple access (CDMA) networks, time division multiple access (TDMA) networks, frequency division multiple access (FDMA) networks, orthogonal FDMA (OFDMA) networks, single carrier FDMA (SC-FDMA) networks, or other types of networks. A CDMA network may implement a radio access technology (RAT) such as universal terrestrial radio access (UTRA), CDMA2000, and/or the like. UTRA may include wideband CDMA (WCDMA) and/or other variants of CDMA. CDMA2000 may include Interim Standard (IS)-2000, IS-95 and IS-856 standards. IS-2000 may also be referred to as 1× radio transmission technology (1×RTT), CDMA2000 1×, and/or the like. A TDMA network may implement a RAT such as global system for mobile communications (GSM), enhanced data rates for GSM evolution (EDGE), or GSM/EDGE radio access network (GERAN). An OFDMA network may implement a RAT such as evolved UTRA (E-UTRA), ultra mobile broadband (UMB), Institute of Electrical and Electronics Engineers (IEEE) 802.11 (Wi-Fi), IEEE 802.16 (WiMAX), IEEE 802.20, Flash-OFDM, and/or the like. UTRA and E-UTRA may be part of the universal mobile telecommunication system (UMTS). 3GPP long-term evolution (LTE) and LTE-Advanced (LTE-A) are example releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and RATs mentioned above as well as other wireless networks and RATs.

Figure 1:
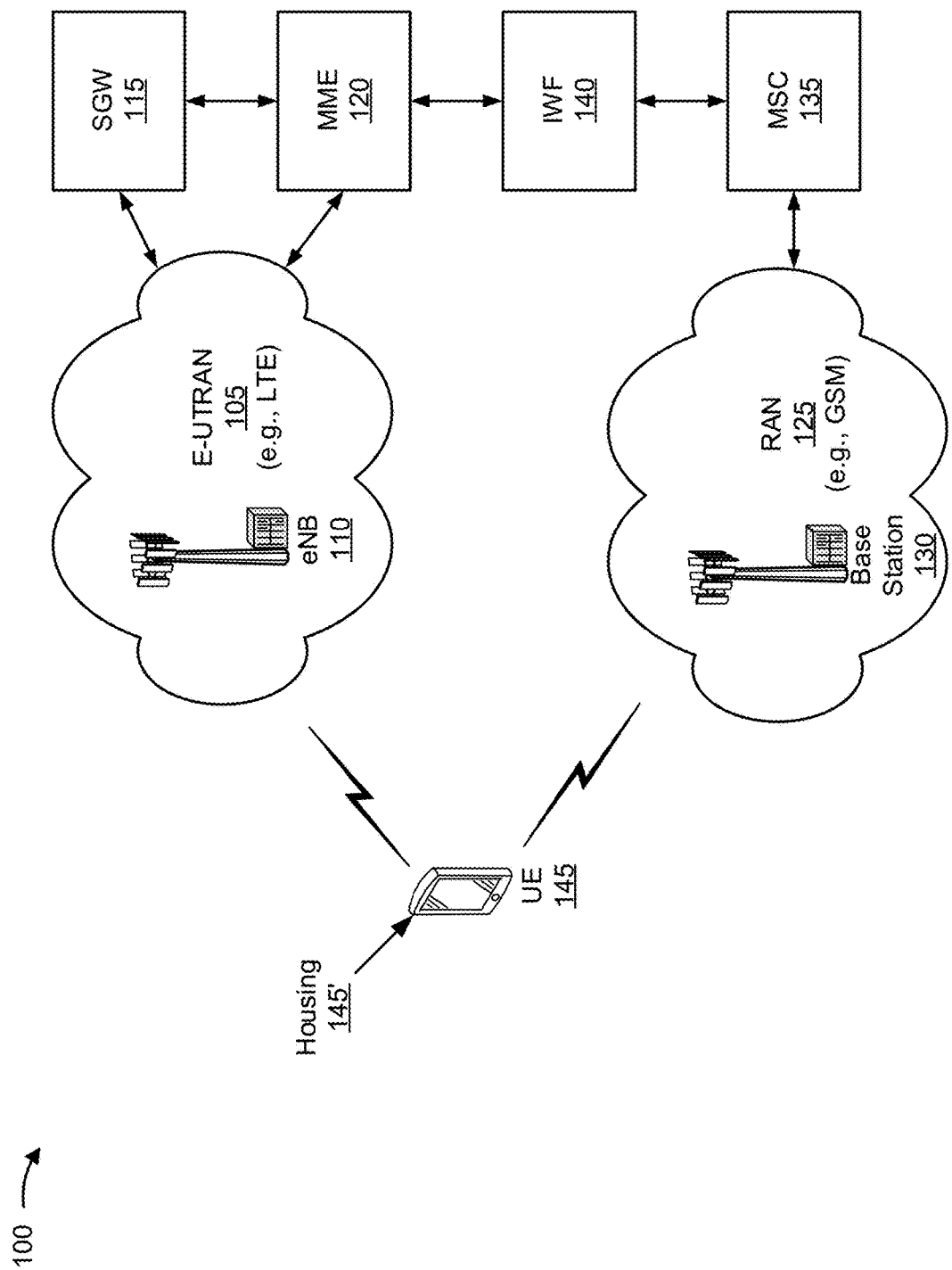
FIG. 1 is a diagram illustrating an example deployment in which multiple wireless networks have overlapping coverage, in accordance with various aspects of the present disclosure.

FIG. 1 is a diagram illustrating an example deployment 100 in which multiple wireless networks have overlapping coverage, in accordance with various aspects of the present disclosure. However, wireless networks may not have overlapping coverage in aspects. As shown, example deployment 100 may include an evolved universal terrestrial radio access network (E-UTRAN) 105, which may include one or more evolved Node Bs (eNBs) 110, and which may communicate with other devices or networks via a serving gateway (SGW) 115 and/or a mobility management entity (MME) 120. As further shown, example deployment 100 may include a radio access network (RAN) 125, which may include one or more base stations 130, and which may communicate with other devices or networks via a mobile switching center (MSC) 135 and/or an inter-working function (IWF) 140. As further shown, example deployment 100 may include one or more user equipment (UEs) 145 capable of communicating via E-UTRAN 105 and/or RAN 125.

E-UTRAN 105 may support, for example, LTE or another type of RAT. E-UTRAN 105 may include eNBs 110 and other network entities that can support wireless communication for UEs 145. Each eNB 110 may provide communication coverage for a particular geographic area. The term "cell" may refer to a coverage area of eNB 110 and/or an eNB subsystem serving the coverage area on a specific frequency channel.

SGW 115 may communicate with E-UTRAN 105 and may perform various functions, such as packet routing and forwarding, mobility anchoring, packet buffering, initiation of network-triggered services, and/or the like. MME 120 may communicate with E-UTRAN 105 and SGW 115 and may perform various functions, such as mobility management, bearer management, distribution of paging messages, security control, authentication, gateway selection, and/or the like, for UEs 145 located within a geographic region served by MME 120 of E-UTRAN 105. The network entities in LTE are described in 3GPP TS 36.300, entitled "Evolved Universal Terrestrial Radio Access (E-UTRA) and Evolved Universal Terrestrial Radio Access Network (E-UTRAN); Overall description," which is publicly available.

RAN 125 may support, for example, GSM or another type of RAT. RAN 125 may include base stations 130 and other network entities that can support wireless communication for UEs 145. MSC 135 may communicate with RAN 125 and may perform various functions, such as voice services, routing for circuit-switched calls, and mobility management for UEs 145 located within a geographic region served by MSC 135 of RAN 125. In some aspects, IWF 140 may facilitate communication between MME 120 and MSC 135 (e.g., when E-UTRAN 105 and RAN 125 use different RATs). Additionally, or alternatively, MME 120 may communicate directly with an MME that interfaces with RAN 125, for example, without IWF 140 (e.g., when E-UTRAN 105 and RAN 125 use a same RAT). In some aspects, E-UTRAN 105 and RAN 125 may use the same frequency and/or the same RAT to communicate with UE 145. In some aspects, E-UTRAN 105 and RAN 125 may use different frequencies and/or RATs to communicate with UEs 145. As used herein, the term base station is not tied to any particular RAT, and may refer to an eNB (e.g., of an LTE network) or another type of base station associated with a different type of RAT.

In general, any number of wireless networks may be deployed in a given geographic area. Each wireless network may support a particular RAT and may operate on one or more frequencies. A RAT may also be referred to as a radio technology, an air interface, and/or the like. A frequency or frequency ranges may also be referred to as a carrier, a frequency channel, and/or the like. Each frequency or frequency range may support a single RAT in a given geographic area in order to avoid interference between wireless networks of different RATs.

UE 145 may be stationary or mobile and may also be referred to as a mobile station, a terminal, an access terminal, a wireless communication device, a subscriber unit, a station, and/or the like. UE 145 may be a cellular phone, a personal digital assistant (PDA), a wireless modem, a wireless communication device, a handheld device, a laptop computer, a cordless phone, a wireless local loop (WLL) station, and/or the like. UE 145 may be included inside a housing 145' that houses components of UE 145, such as processor components, memory components, and/or the like.

Upon power up, UE 145 may search for wireless networks from which UE 145 can receive communication services. If UE 145 detects more than one wireless network, then a wireless network with the highest priority may be selected to serve UE 145 and may be referred to as the serving network. UE 145 may perform registration with the serving network, if necessary. UE 145 may then operate in a connected mode to actively communicate with the serving network. Alternatively, UE 145 may operate in an idle mode and camp on the serving network if active communication is not required by UE 145.

UE 145 may operate in the idle mode as follows. UE 145 may identify all frequencies/RATs on which it is able to find a "suitable" cell in a normal scenario or an "acceptable" cell in an emergency scenario, where "suitable" and "acceptable" are specified in the LTE standards. UE 145 may then camp on the frequency/RAT with the highest priority among all identified frequencies/RATs. UE 145 may remain camped on this frequency/RAT until either (i) the frequency/RAT is no longer available at a predetermined threshold or (ii) another frequency/RAT with a higher priority reaches this threshold. In some aspects, UE 145 may receive a neighbor list when operating in the idle mode, such as a neighbor list included in a system information block type 5 (SIB 5) provided by an eNB of a RAT on which UE 145 is camped. Additionally, or alternatively, UE 145 may generate a neighbor list. A neighbor list may include information identifying one or more frequencies, at which one or more RATs may be accessed, priority information associated with the one or more RATs, and/or the like.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Figure 2:
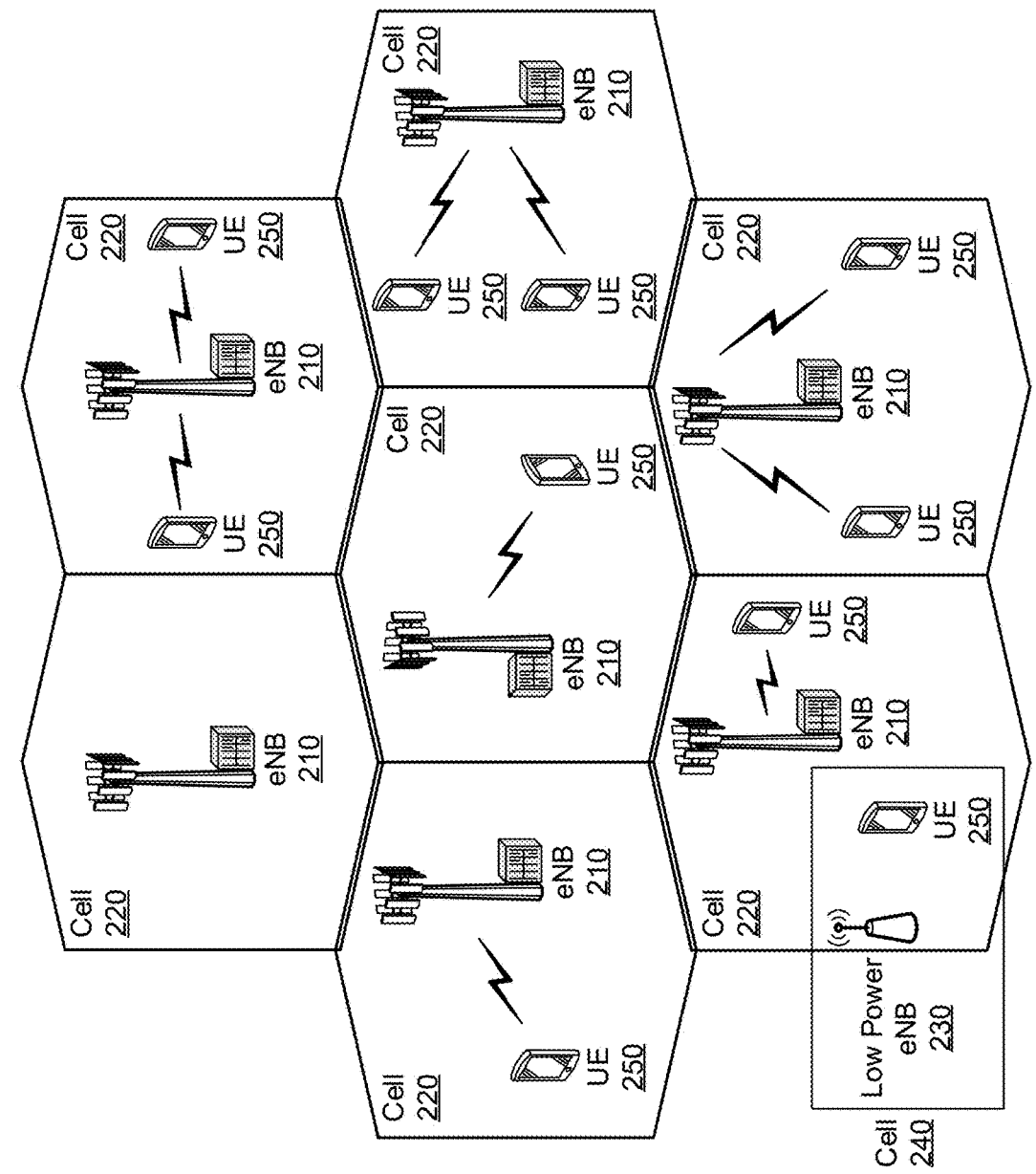
FIG. 2 is a diagram illustrating an example access network in an LTE network architecture, in accordance with various aspects of the present disclosure.

FIG. 2 is a diagram illustrating an example access network 200 in an LTE network architecture, in accordance with various aspects of the present disclosure. As shown, access network 200 may include one or more eNBs 210 (sometimes referred to as "base stations" herein) that serve a corresponding set of cellular regions (cells) 220, one or more low power eNBs 230 that serve a corresponding set of cells 240, and a set of UEs 250.

Each eNB 210 may be assigned to a respective cell 220 and may be configured to provide an access point to a RAN. For example, eNB 110, 210 may provide an access point for UE 145, 250 to E-UTRAN 105 (e.g., eNB 210 may correspond to eNB 110, shown in FIG. 1) or may provide an access point for UE 145, 250 to RAN 125 (e.g., eNB 210 may correspond to base station 130, shown in FIG. 1). In some cases, the terms base station and eNB may be used interchangeably, and a base station, as used herein, is not tied to any particular RAT. UE 145, 250 may correspond to UE 145, shown in FIG. 1. FIG. 2 does not illustrate a centralized controller for example access network 200, but access network 200 may use a centralized controller in some aspects. The eNBs 210 may perform radio related functions including radio bearer control, admission control, mobility control, scheduling, security, and network connectivity (e.g., to SGW 115).

As shown in FIG. 2, one or more low power eNBs 230 may serve respective cells 240, which may overlap with one or more cells 220 served by eNBs 210. The eNBs 230 may correspond to eNB 110 associated with E-UTRAN 105 and/or base station 130 associated with RAN 125, shown in FIG. 1. A low power eNB 230 may be referred to as a remote radio head (RRH). The low power eNB 230 may include a femto cell eNB (e.g., home eNB (HeNB)), a pico cell eNB, a micro cell eNB, and/or the like.

A modulation and multiple access scheme employed by access network 200 may vary depending on the particular telecommunications standard being deployed. In LTE applications, OFDM is used on the downlink (DL) and SC-FDMA is used on the uplink (UL) to support both frequency division duplexing (FDD) and time division duplexing (TDD). The various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. As another example, these concepts may also be extended to UTRA employing WCDMA and other variants of CDMA (e.g., such as TD-SCDMA, GSM employing TDMA, E-UTRA, and/or the like), UMB, IEEE 802.11 (Wi-Fi), IEEE 802.16 (WiMAX), IEEE 802.20, Flash-OFDM employing OFDMA, and/or the like. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 210 may have multiple antennas supporting MIMO technology. The use of MIMO technology enables eNBs 210 to exploit the spatial domain to support spatial multiplexing, beamforming, and transmit diversity. Spatial multiplexing may be used to transmit different streams of data simultaneously on the same frequency. The data streams may be transmitted to a single UE 145, 250 to increase the data rate or to multiple UEs 250 to increase the overall system capacity. This may be achieved by spatially precoding each data stream (e.g., applying a scaling of an amplitude and a phase) and then transmitting each spatially precoded stream through multiple transmit antennas on the DL. The spatially precoded data streams arrive at the UE(s) 250 with different spatial signatures, which enables each of the UE(s) 250 to recover the one or more data streams destined for that UE 145, 250. On the UL, each UE 145, 250 transmits a spatially precoded data stream, which enables eNBs 210 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

The number and arrangement of devices and cells shown in FIG. 2 are provided as an example. In practice, there may be additional devices and/or cells, fewer devices and/or cells, different devices and/or cells, or differently arranged devices and/or cells than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) shown in FIG. 2 may perform one or more functions described as being performed by another set of devices shown in FIG. 2.

Figure 3:
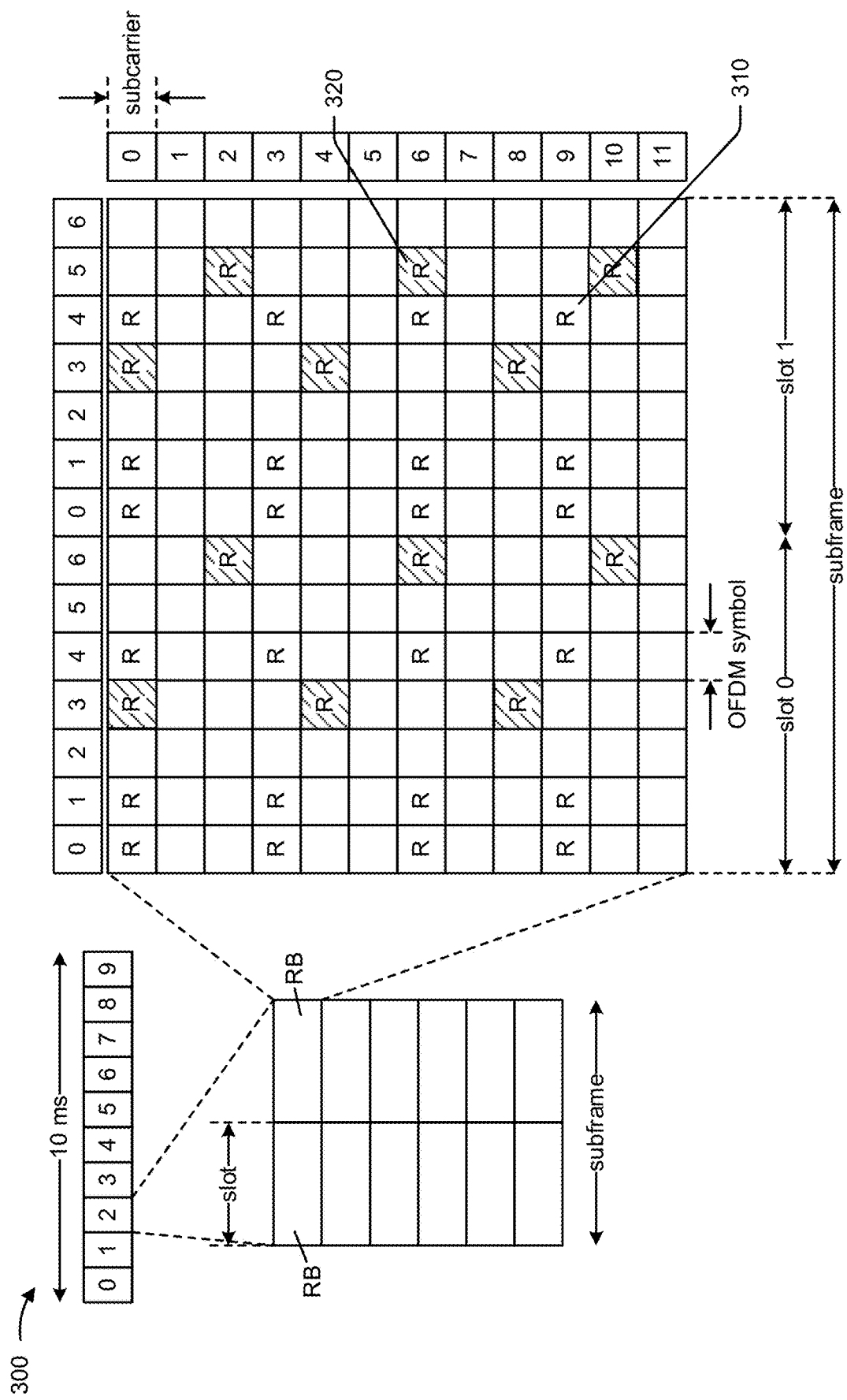
FIG. 3 is a diagram illustrating an example of a downlink frame structure in LTE, in accordance with various aspects of the present disclosure.

FIG. 3 is a diagram illustrating an example 300 of a downlink (DL) frame structure in LTE, in accordance with various aspects of the present disclosure. A frame (e.g., of 10 ms) may be divided into 10 equally sized sub-frames with indices of 0 through 9. Each sub-frame may include two consecutive time slots. A resource grid may be used to represent two time slots, each time slot including a resource block (RB). The resource grid is divided into multiple resource elements. In LTE, a resource block includes 12 consecutive subcarriers in the frequency domain and, for a normal cyclic prefix in each OFDM symbol, 7 consecutive OFDM symbols in the time domain, or 84 resource elements. For an extended cyclic prefix, a resource block includes 6 consecutive OFDM symbols in the time domain and has 72 resource elements. Some of the resource elements, as indicated as R 310 and R 320, include DL reference signals (DL-RS). The DL-RS include Cell-specific RS (CRS) (also sometimes called common RS) 310 and UE-specific RS (UE-RS) 320. UE-RS 320 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix (CP). The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in the first symbol period of each subframe. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. The eNB may send a Physical HARQ Indicator Channel (PHICH) and a Physical Downlink Control Channel (PDCCH) in the first M symbol periods of each subframe. The PHICH may carry information to support hybrid automatic repeat request (HARQ). The PDCCH may carry information on resource allocation for UEs and control information for downlink channels. The eNB may send a Physical Downlink Shared Channel (PDSCH) in the remaining symbol periods of each subframe. The PDSCH may carry data for UEs scheduled for data transmission on the downlink.

The eNB may send the PSS, SSS, and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH, and PHICH in a broadcast manner to all UEs, may send the PDCCH in a unicast manner to specific UEs, and may also send the PDSCH in a unicast manner to specific UEs.

A number of resource elements may be available in each symbol period. Each resource element (RE) may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1, and 2. The PDCCH may occupy 9, 18, 36, or 72 REGs, which may be selected from the available REGs, in the first M symbol periods, for example. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

As indicated above, FIG. 3 is provided as an example. Other examples are possible and may differ from what was described above in connection with FIG. 3.

Figure 4:
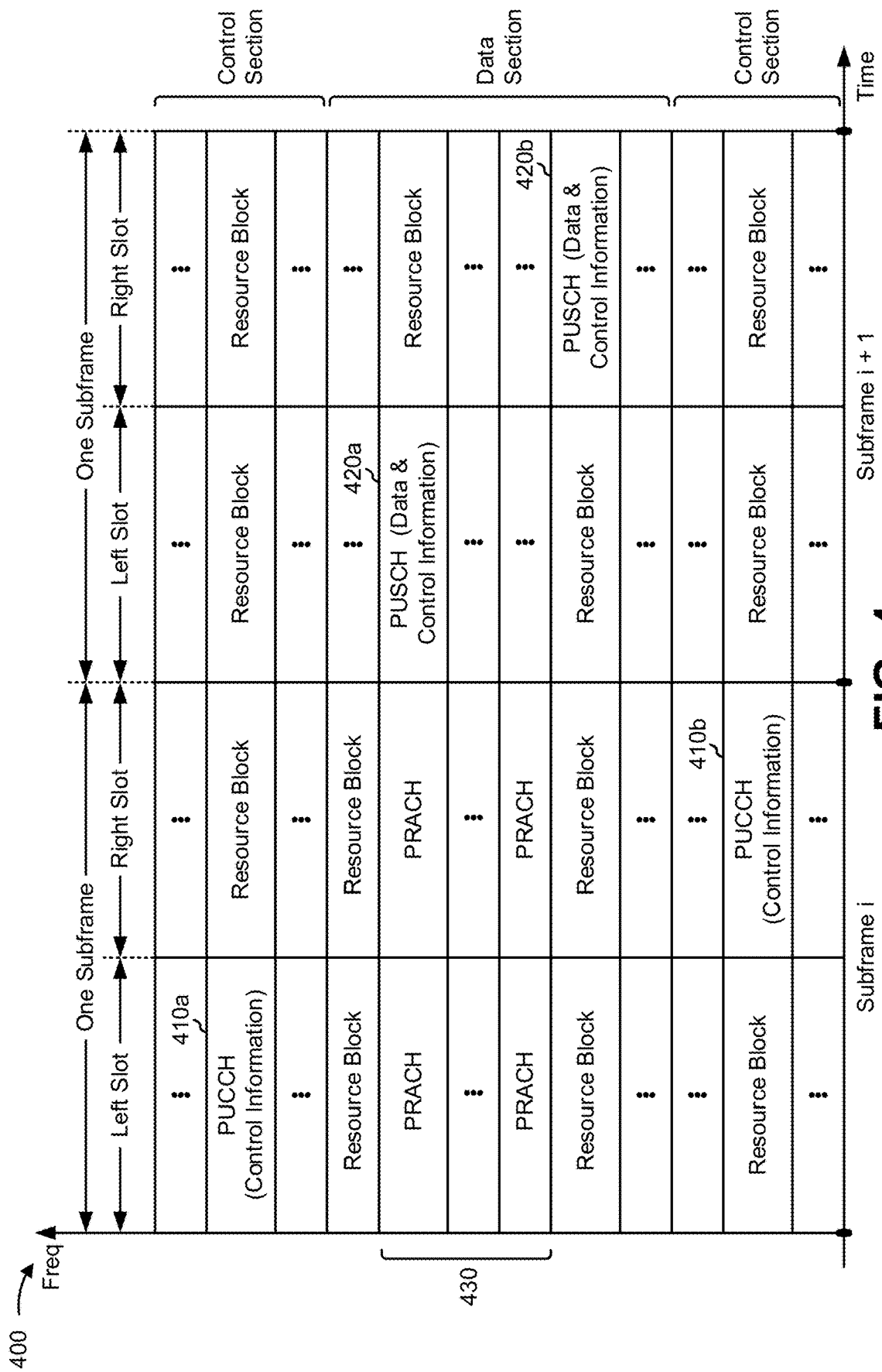
FIG. 4 is a diagram illustrating an example of an uplink frame structure in LTE, in accordance with various aspects of the present disclosure.

FIG. 4 is a diagram illustrating an example 400 of an uplink (UL) frame structure in LTE, in accordance with various aspects of the present disclosure. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequencies.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (e.g., of 1 ms) or in a sequence of few contiguous subframes and a UE can make only a single PRACH attempt per frame (e.g., of 10 ms).

As indicated above, FIG. 4 is provided as an example. Other examples are possible and may differ from what was described above in connection with FIG. 4.

Figure 5:
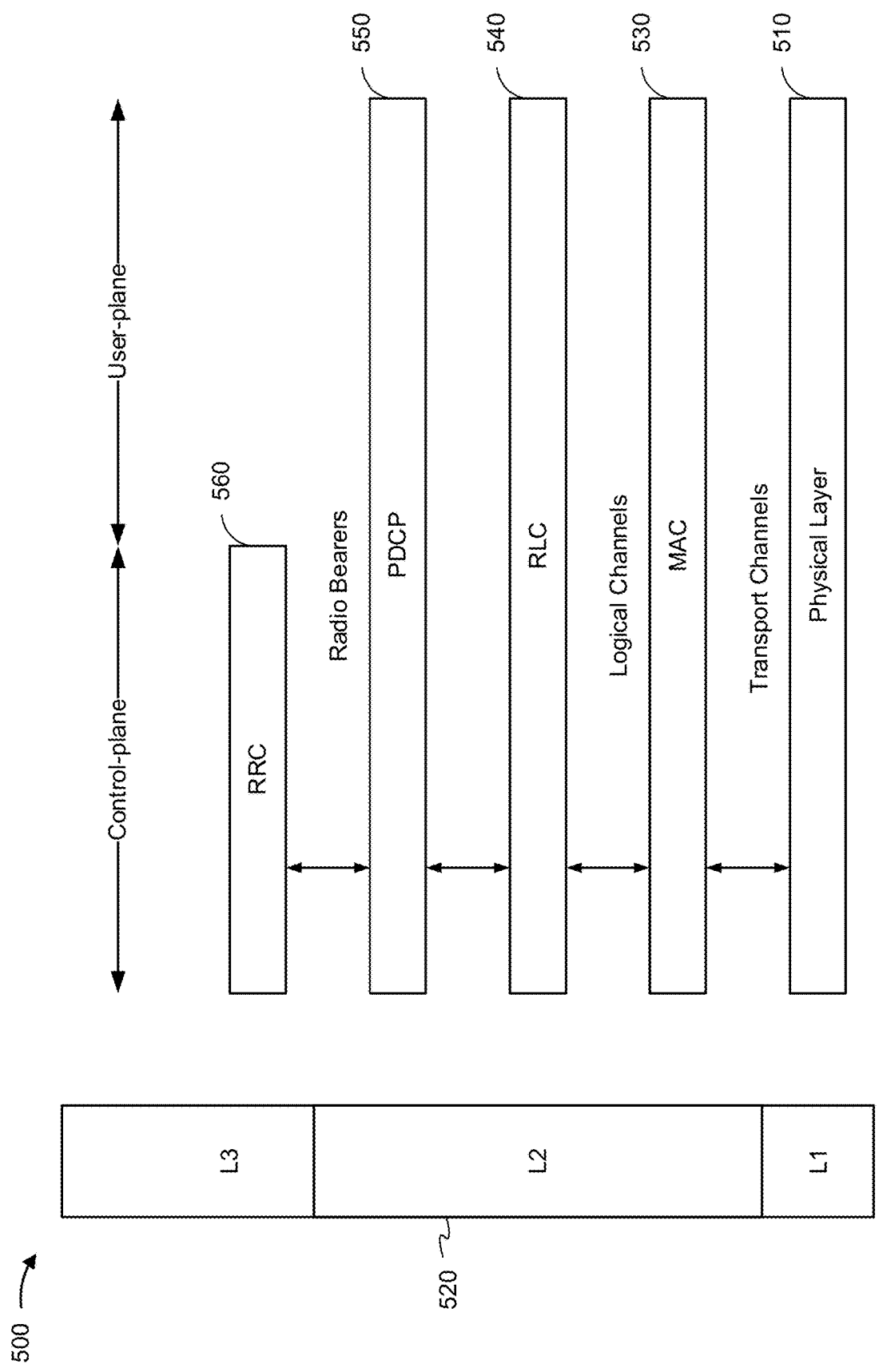
FIG. 5 is a diagram illustrating an example of a radio protocol architecture for a user plane and a control plane in LTE, in accordance with various aspects of the present disclosure.

FIG. 5 is a diagram illustrating an example 500 of a radio protocol architecture for a user plane and a control plane in LTE, in accordance with various aspects of the present disclosure. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 510. Layer 2 (L2 layer) 520 is above the physical layer 510 and is responsible for the link between the UE and eNB over the physical layer 510.

In the user plane, the L2 layer 520 includes, for example, a media access control (MAC) sublayer 530, a radio link control (RLC) sublayer 540, and a packet data convergence protocol (PDCP) sublayer 550, which are terminated at the eNB on the network side. Although not shown, the UE may have several upper layers above the L2 layer 520 including a network layer (e.g., IP layer) that is terminated at a packet data network (PDN) gateway on the network side, and an application layer that is terminated at the other end of the connection (e.g., a far end UE, a server, and/or the like).

The PDCP sublayer 550 provides retransmission of lost data in handover. The PDCP sublayer 550 also provides header compression for upper layer data packets to reduce radio transmission overhead, security by ciphering the data packets, and handover support for UEs between eNBs. The RLC sublayer 540 provides segmentation and reassembly of upper layer data packets, retransmission of lost data packets, and reordering of data packets to compensate for out-of-order reception due to hybrid automatic repeat request (HARQ). The MAC sublayer 530 provides multiplexing between logical and transport channels. The MAC sublayer 530 is also responsible for allocating the various radio resources (e.g., resource blocks) in one cell among the UEs. The MAC sublayer 530 is also responsible for HARQ operations.

In the control plane, the radio protocol architecture for the UE and eNB is substantially the same for the physical layer 510 and the L2 layer 520 with the exception that there is no header compression function for the control plane. The control plane also includes a radio resource control (RRC) sublayer 560 in Layer 3 (L3 layer). The RRC sublayer 560 is responsible for obtaining radio resources (i.e., radio bearers) and for configuring the lower layers using RRC signaling between the eNB and the UE.

As indicated above, FIG. 5 is provided as an example. Other examples are possible and may differ from what was described above in connection with FIG. 5.

Figure 6:
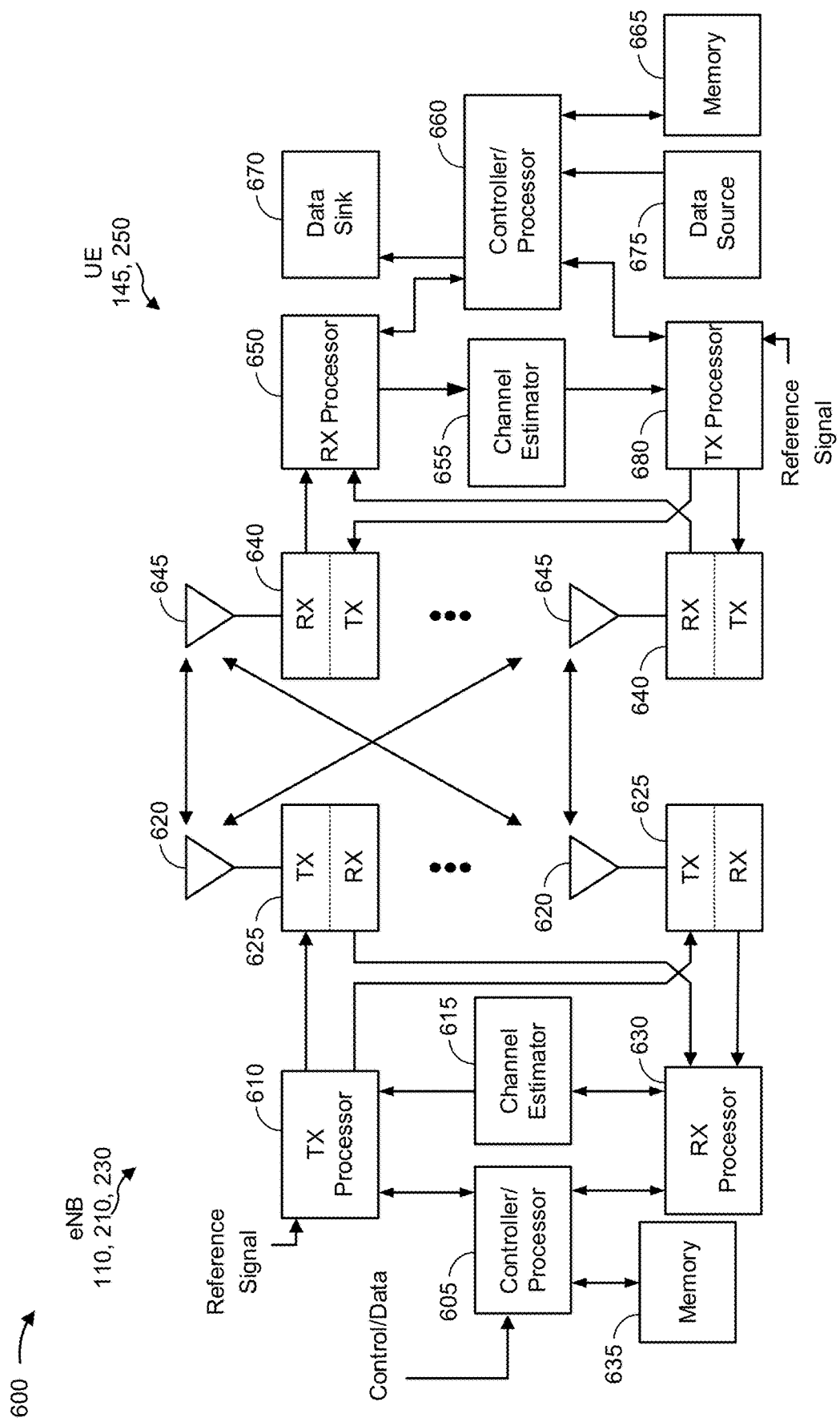
FIG. 6 is a diagram illustrating example components of an evolved Node B and a user equipment in an access network, in accordance with various aspects of the present disclosure.

FIG. 6 is a diagram illustrating example components 600 of a base station such as an eNB 110, 210, 230 and a UE 145, 250 in an access network, in accordance with various aspects of the present disclosure. As shown in FIG. 6, eNB 110, 210, 230 may include a controller/processor 605, a TX processor 610, a channel estimator 615, an antenna 620, a transmitter 625TX, a receiver 625RX, an RX processor 630, and a memory 635. As further shown in FIG. 6, UE 145, 250 may include a receiver RX, for example, of a transceiver TX/RX 640, a transmitter TX, for example, of a transceiver TX/RX 640, an antenna 645, an RX processor 650, a channel estimator 655, a controller/processor 660, a memory 665, a data sink 670, a data source 675, and a TX processor 680.

In the DL, upper layer packets from the core network are provided to controller/processor 605. The controller/processor 605 implements the functionality of the L2 layer. In the DL, the controller/processor 605 provides header compression, ciphering, packet segmentation and reordering, multiplexing between logical and transport channels, and radio resource allocations to the UE 145, 250 based, at least in part, on various priority metrics. The controller/processor 605 is also responsible for HARQ operations, retransmission of lost packets, and signaling to the UE 145, 250.

The TX processor 610 implements various signal processing functions for the L1 layer (e.g., physical layer). The signal processing functions includes coding and interleaving to facilitate forward error correction (FEC) at the UE 145, 250 and mapping to signal constellations based, at least in part, on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 615 may be used to determine the coding and modulation scheme, as well as for spatial processing. The channel estimate may be derived from a reference signal and/or channel condition feedback transmitted by the UE 145, 250. Each spatial stream is then provided to a different antenna 620 via a separate transmitter TX, for example, of transceiver TX/RX 625. Each such transmitter TX modulates an RF carrier with a respective spatial stream for transmission.

At the UE 145, 250, each receiver RX, for example, of a transceiver TX/RX 640 receives a signal through its respective antenna 645. Each such receiver RX recovers information modulated onto an RF carrier and provides the information to the receiver (RX) processor 650. The RX processor 650 implements various signal processing functions of the L1 layer. The RX processor 650 performs spatial processing on the information to recover any spatial streams destined for the UE 145, 250. If multiple spatial streams are destined for the UE 145, 250, the spatial streams may be combined by the RX processor 650 into a single OFDM symbol stream. The RX processor 650 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 110, 210, 230. These soft decisions may be based, at least in part, on channel estimates computed by the channel estimator 655. The soft decisions are then decoded and deinterleaved to recover the data and control signals that were originally transmitted by the eNB 110, 210, 230 on the physical channel. The data and control signals are then provided to the controller/processor 660.

The controller/processor 660 implements the L2 layer. The controller/processor 660 can be associated with a memory 665 that stores program codes and data. The memory 665 may include a non-transitory computer-readable medium. In the UL, the controller/processor 660 provides demultiplexing between transport and logical channels, packet reassembly, deciphering, header decompression, control signal processing to recover upper layer packets from the core network. The upper layer packets are then provided to a data sink 670, which represents all the protocol layers above the L2 layer. Various control signals may also be provided to the data sink 670 for L3 processing. The controller/processor 660 is also responsible for error detection using an acknowledgement (ACK) and/or negative acknowledgement (NACK) protocol to support HARQ operations.

In the UL, a data source 675 is used to provide upper layer packets to the controller/processor 660. The data source 675 represents all protocol layers above the L2 layer. Similar to the functionality described in connection with the DL transmission by the eNB 110, 210, 230, the controller/processor 660 implements the L2 layer for the user plane and the control plane by providing header compression, ciphering, packet segmentation and reordering, and multiplexing between logical and transport channels based, at least in part, on radio resource allocations by the eNB 110, 210, 230. The controller/processor 660 is also responsible for HARQ operations, retransmission of lost packets, and signaling to the eNB 110, 210, 230.

Channel estimates derived by a channel estimator 655 from a reference signal or feedback transmitted by the eNB 110, 210, 230 may be used by the TX processor 680 to select the appropriate coding and modulation schemes, and to facilitate spatial processing. The spatial streams generated by the TX processor 680 are provided to different antenna 645 via separate transmitters TX, for example, of transceivers TX/RX 640. Each transmitter TX, for example, of transceiver TX/RX 640 modulates an RF carrier with a respective spatial stream for transmission.

The UL transmission is processed at the eNB 110, 210, 230 in a manner similar to that described in connection with the receiver function at the UE 145, 250. Each receiver RX, for example, of transceiver TX/RX 625 receives a signal through its respective antenna 620. Each receiver RX, for example, of transceiver TX/RX 625 recovers information modulated onto an RF carrier and provides the information to an RX processor 630. The RX processor 630 may implement the L1 layer.

The controller/processor 605 implements the L2 layer. The controller/processor 605 can be associated with a memory 635 that stores program code and data. The memory 635 may be referred to as a computer-readable medium. In the UL, the controller/processor 605 provides demultiplexing between transport and logical channels, packet reassembly, deciphering, header decompression, control signal processing to recover upper layer packets from the UE 145, 250. Upper layer packets from the controller/processor 605 may be provided to the core network. The controller/processor 605 is also responsible for error detection using an ACK and/or NACK protocol to support HARQ operations.

In some aspects, one or more components of UE 145, 250 may be included in a housing 145', as shown in FIG. 1. One or more components of UE 145, 250 may be configured to mitigate VCO frequency disturbance, as described in more detail elsewhere herein. For example, the controller/processor 660 and/or other processors and modules of UE 145, 250 may perform or direct operations of, for example, process 900 of FIG. 9, process 1000 of FIG. 10, and/or other processes as described herein. In some aspects, one or more of the components shown in FIG. 6 may be employed to perform example process 900, example process 1000, and/or other processes for the techniques described herein.

In some aspects, UE 145, 250 may include means for tuning a first VCO to an offset frequency from a particular frequency, wherein the offset frequency differs from the particular frequency by an offset, wherein the offset is based at least in part on at least one parameter, and wherein UE 145, 250 is configured to operate in an at least one carrier mode associated with at least one time division duplexed carrier; means for communicating, while the first VCO is tuned to the offset frequency, a communication associated with a second VCO, wherein the second VCO is tuned to the particular frequency, and/or the like. Additionally, or alternatively, UE 145, 250 may include means for determining an offset associated with tuning a frequency of a first VCO from a particular frequency to an offset frequency, wherein UE 145, 250 includes the first VCO and at least a second VCO, all of which are configured to communicate using the particular frequency, and wherein UE 145, 250 is configured to operate in an at least one carrier mode associated with at least one time division duplexed carrier; and means for communicating, after tuning the frequency of the first VCO from the particular frequency to the offset frequency, a communication associated with one of the at least the second VCO, wherein the one of the at least the second VCO is tuned to the particular frequency, and wherein the offset is determined based at least in part on the communicating, and/or the like.

The number and arrangement of components shown in FIG. 6 are provided as an example. In practice, there may be additional components, fewer components, different components, or differently arranged components than those shown in FIG. 6. Furthermore, two or more components shown in FIG. 6 may be implemented within a single component, or a single component shown in FIG. 6 may be implemented as multiple, distributed components. Additionally, or alternatively, a set of components (e.g., one or more components) shown in FIG. 6 may perform one or more functions described as being performed by another set of components shown in FIG. 6.

Figure 7A:
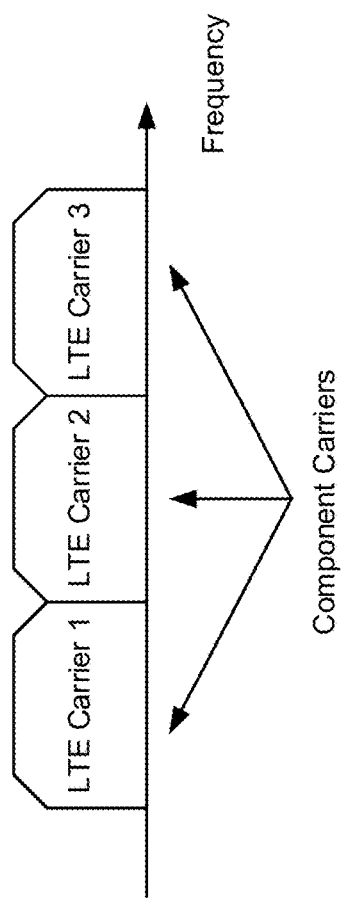
FIGS. 7A and 7B are diagrams illustrating example carrier aggregation types, in accordance with various aspects of the present disclosure.
Figure 7B:
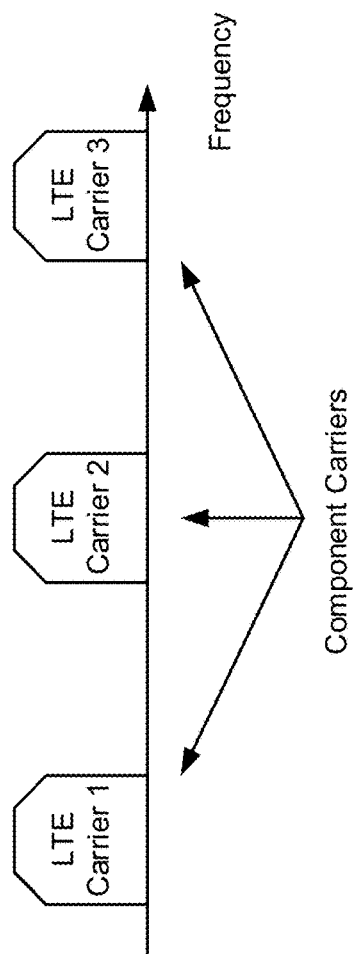

FIGS. 7A and 7B are illustrations of examples 700 of carrier aggregation types, in accordance with various aspects of the present disclosure.

In some aspects, UE 145, 250 may use spectrum of up to 20 MHz bandwidths allocated in a carrier aggregation of up to a total of 100 MHz (e.g., 5 component carriers) used for transmission and reception. For an LTE-Advanced enabled wireless communication system, two types of carrier aggregation (CA) methods may be used, contiguous CA and non-contiguous CA, which are illustrated in FIGS. 7A and 7B, respectively. Contiguous CA occurs when multiple available component carriers are adjacent to each other (e.g., as illustrated in FIG. 7A). On the other hand, non-contiguous CA occurs when multiple non-adjacent available component carriers are separated along the frequency band (e.g., as illustrated in FIG. 7B) and/or are included in different frequency bands.

Both non-contiguous and contiguous CA may aggregate multiple component carriers to serve a single unit of LTE-Advanced UEs 145, 250. In various examples, UE 145, 250 operating in a multicarrier system (e.g., also referred to as carrier aggregation) is configured to aggregate certain functions of multiple carriers, such as control and feedback functions, on the same carrier, which may be referred to as a primary carrier. The remaining carriers that depend on the primary carrier for support may be referred to as secondary carriers. For example, UE 145, 250 may aggregate control functions such as those provided by the optional dedicated channel (DCH), the nonscheduled grants, a physical uplink control channel (PUCCH), and/or a physical downlink control channel (PDCCH).

As indicated above, FIGS. 7A and 7B are provided as examples. Other examples are possible and may differ from what was described in connection with FIGS. 7A and 7B.

A voltage controlled oscillator (VCO) frequency disturbance, such as VCO pulling, is an issue often seen where multiple VCOs (e.g., phase-locked loops (PLLs), frequency oscillators, and/or the like), included in a UE, are tuned to a same or a similar frequency. For example, VCO pulling can occur when a UE operates in a carrier mode associated with a time division duplexed (TDD) carrier without CA (e.g., since a receiver (Rx) VCO and a transmitter (Tx) VCO will be configured to operate at the same frequency, while operating separately in the time domain).

As another example, VCO pulling can occur when a UE operates in a CA mode associated with multiple carriers. Such cases may include, for example, a CA mode associated with at least one TDD carrier and at least one frequency division duplexed (FDD) carrier, a CA mode associated with at least two TDD carriers, and/or the like. Here, VCO pulling can occur in association with a single TDD carrier, as described above, and/or in association with different carriers (e.g., when an Rx VCO, associated with a first carrier, operates at a frequency that is close to that of a Tx VCO associated with a second carrier).

As still another example, VCO pulling can occur when a UE operates in a carrier mode associated with allowing LTE network communications and wireless local area network (WLAN) communications to co-exist in the UE (e.g., an LTE with WiFi co-existence mode). Here, VCO pulling can occur when, for example, an Rx VCO, associated with LTE communications, operates at a similar frequency to that of a Tx VCO associated with WLAN communications.

In some cases, VCO pulling may result in phase noise degradation, in-band spurs, frequency drift, and/or the like, which translates into sensitivity degradation, increased block error rate, throughput degradation, and/or the like, associated with communications received or transmitted by the UE. Thus, VCO pulling should be mitigated and/or prevented, when possible.

Further, VCO pulling becomes more likely as both a number of VCOs included in a given UE increases, while an amount of space between these VCOs decreases, such as in the case of a transceiver, included in a UE, that includes multiple VCOs on a single integrated circuit in order to support CA. As such, as the number of VCOs increases and the spacing between VCOs decreases, mitigating VCO pulling becomes increasingly important. However, previous techniques for mitigating VCO pulling may be difficult and/or undesirable to practically implement in such cases.

For example, one possible solution for mitigating VCO pulling of a first VCO on a second VCO is to include additional hardware circuitry in the second VCO in order to negate an effect of the VCO pulling by injecting an equal cancelling signal of an opposite phase. In such a case, the first VCO may similarly include hardware circuitry in order to negate an effect of VCO pulling of the second VCO. Additional VCOs on the chip would require similar additional hardware. However, such a solution is of limited practical use since additional hardware is needed, which increases cost and/or size of an integrated circuit including the first and second VCOs.

Another possible solution for mitigating VCO pulling is to design an integrated circuit such that the first and second VCOs are spaced apart sufficient to minimize effects of mutual VCO pulling. Again, such a solution is not practical since a desired size of integrated circuits continues to decrease.

Further, solutions associated with mitigating VCO pulling for VCOs located on different chips are not of practical use in a case where multiple VCOs are included on the same chip. Moreover, powering-off a VCO when the VCO is not being used is not a viable solution since powering-on the VCO for a subsequent use may require a significant amount of time (e.g., more than 100 microseconds), which may be more time than is available in a given wireless communication scenario.

Some aspects described herein address a VCO frequency disturbance (e.g., VCO pulling), associated with a UE, by maintaining a frequency offset between VCOs (e.g., an Rx VCO and a Tx VCO located on a same chip) that are to operate at a same or a similar frequency. In some aspects, the frequency offset technique, described herein, may be implemented for a UE that operates in a carrier mode associated with a TDD carrier without CA, a carrier mode associated with multiple TDD and/or FDD carriers with CA, an LTE with WiFi co-existence mode, or another carrier mode for which at least two VCOs are to operate at a same or a similar frequency.

Figure 8A:
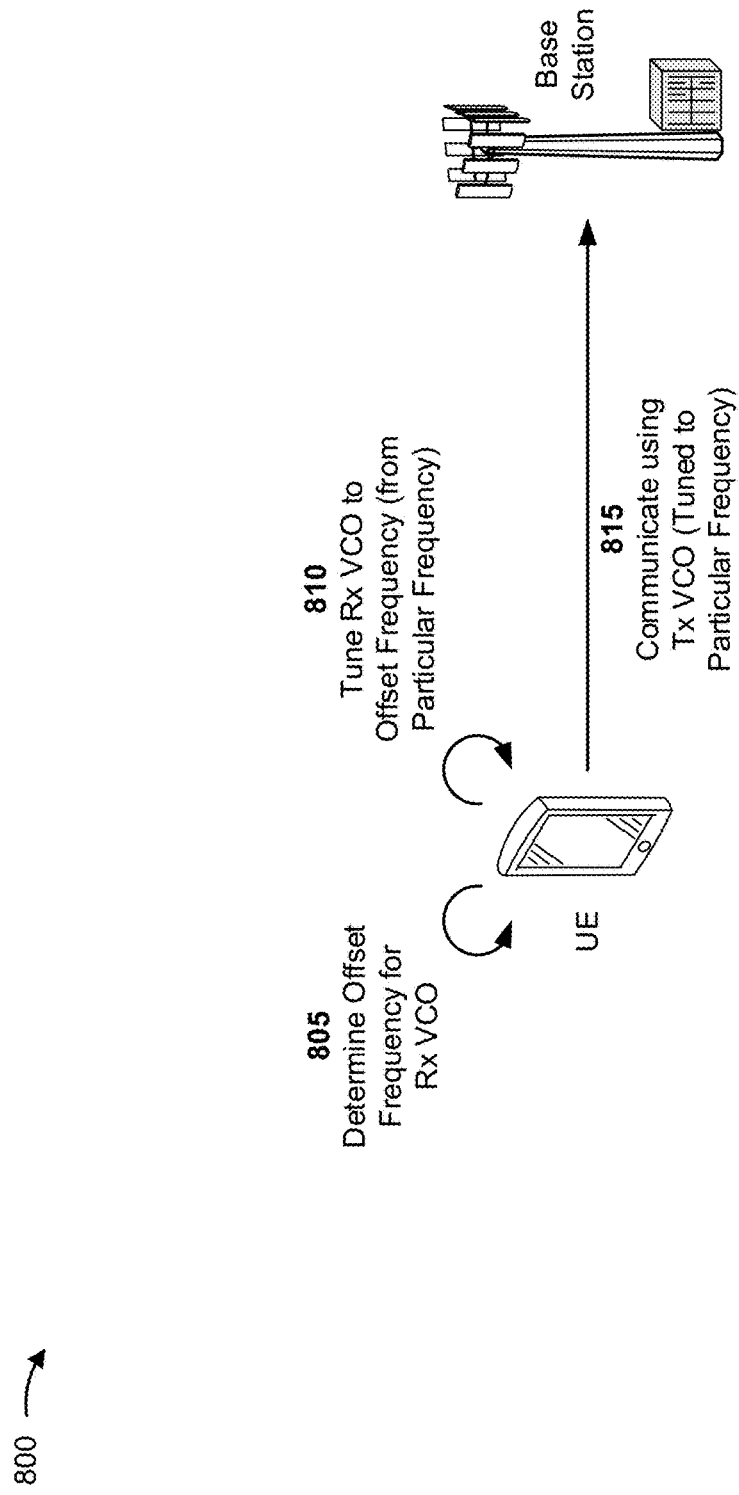
FIGS. 8A and 8B are diagrams illustrating an example of mitigating voltage controlled oscillator frequency disturbance between at least two voltage controlled oscillators, in accordance with various aspects of the present disclosure.
Figure 8B:
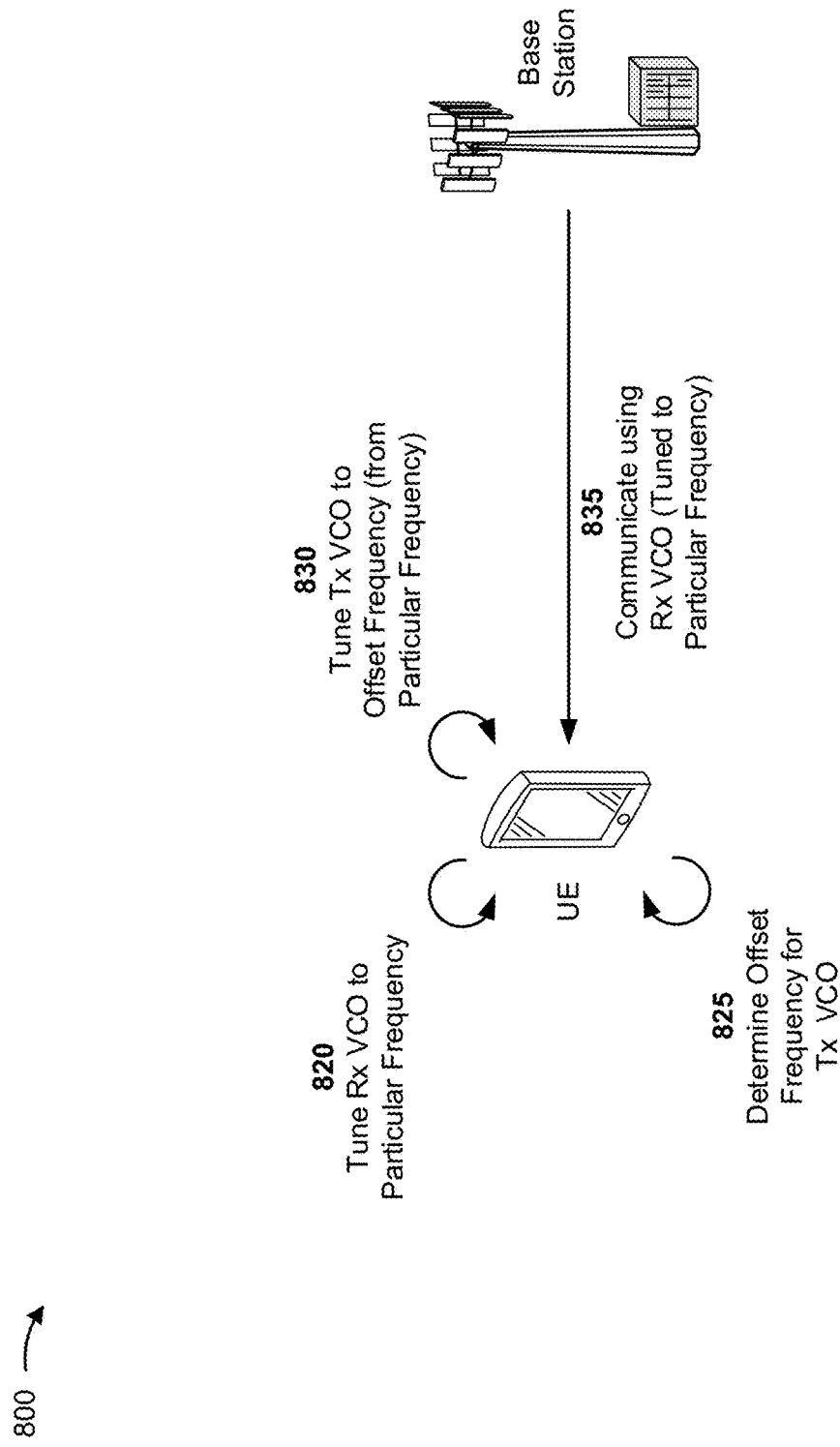

FIGS. 8A and 8B are diagrams illustrating an example 800 of mitigating VCO frequency disturbance (e.g., VCO pulling) between at least two VCOs, in accordance with various aspects of the present disclosure.

In example 800, a UE (e.g., UE 145, 250) includes an Rx VCO and a Tx VCO, associated with different directions of communication (e.g., a DL direction and an UL direction, respectively), that are configured to operate at a same or similar frequency. For example, the UE may operate in a carrier mode associated with a single TDD carrier (without CA). Here, the Rx VCO is associated with receiving wireless communications at a particular frequency associated with the TDD carrier, and the Tx VCO is associated with transmitting wireless communications at the particular frequency associated with the TDD carrier.

As another example, the UE may operate in a CA mode associated with a TDD carrier and at least one other TDD carrier and/or at least one FDD carrier. In this example, the Rx VCO is associated with receiving wireless communications at a first particular frequency associated with the TDD carrier, and the Tx VCO is associated with transmitting wireless communications at the first particular frequency associated with the TDD carrier. Further, in the case of CA with at least one other TDD carrier, a third VCO is associated with receiving wireless communications at a second particular frequency associated with another TDD carrier, and a fourth VCO is associated with transmitting wireless communications at the second particular frequency associated with the other TDD carrier. The second particular frequency is similar to or close to the first particular frequency. Conversely, in the case of CA with at least one FDD carrier, a third VCO is associated with communicating (e.g., either receiving or transmitting) wireless communications at the second particular frequency, associated with the FDD carrier, while a fourth VCO is associated with communicating (e.g., either transmitting or receiving) wireless communications at a third particular frequency associated with the FDD carrier.

As yet another example, the UE may operate in an LTE with WiFi co-existence mode. In this example, the first VCO is associated with receiving wireless communications at a first particular frequency associated with the TDD carrier for LTE communications, and a second VCO is associated with transmitting wireless communications at the particular frequency associated with the TDD carrier for LTE communications. Further, a third VCO and a fourth VCO, associated with a carrier for WiFi communications, may be associated with communicating wireless communications at the second particular frequency.

Generally, in example 800, the UE operates in a carrier mode for which at least two VCOs, associated with different directions of communication, are to operate at a same or a similar frequency. As described below, in some aspects, the UE may mitigate VCO frequency disturbance (e.g., VCO pulling) among the at least two VCOs based at least in part on tuning a VCO, of the at least two VCOs, to an offset frequency while another VCO is used to for wireless communications.

In FIG. 8A, assume that the UE is to transmit a wireless communication (e.g., an UL communication), associated with a TDD carrier, to a base station. Here, assume that the Rx VCO and the Tx VCO are tuned to a particular frequency associated with the TDD carrier.

As shown in FIG. 8A, and by reference number 805, the UE may determine an offset frequency associated with the Rx VCO. In some aspects, an offset frequency is a frequency to which a VCO is tuned in order to mitigate and/or prevent VCO pulling of the VCO on another VCO. For example, the offset frequency may be a frequency to which the Rx VCO is tuned in order to mitigate and/or prevent VCO pulling of the Rx VCO on the Tx VCO while the Tx VCO is used in association with transmitting a wireless communication. As another example, the offset frequency may be a frequency to which the Tx VCO is tuned in order to mitigate and/or prevent VCO pulling of the Tx VCO on the Rx VCO while the Rx VCO is used in association with receiving a wireless communication (an example of which is described below in association with FIG. 8B). In some aspects, the offset frequency may differ from the particular frequency by an offset. In some aspects, the same offset may be used to tune different VCOs (e.g., such that the Rx VCO and the Tx VCO will be tuned to a same offset frequency). Additionally, or alternatively, different offsets may be used to tune different VCOs (e.g., such that two or more VCOs may be tuned to a different offset frequency).

In some aspects, the UE may determine the offset based at least in part on offset information stored by the UE. The offset information may include information that identifies a set of offsets that may be used by the UE for mitigating or preventing VCO frequency disturbance, such as VCO pulling. For example, the offset information may include information that identifies a set of offsets, where each offset is associated with at least one frequency band, at least one subframe configuration, and/or the like, for a given direction of wireless communication (e.g., an UL direction, a DL direction). Here, the UE may identify a frequency band of the TDD carrier and a subframe configuration to be used for wireless communications, and may identify the offset as an offset, included in the set of offsets, that is associated with the frequency band and the subframe configuration identified by the UE for the given direction of wireless communication. In some aspects, within the offset information, multiple offsets may be associated with a given frequency band. Here, each of the multiple offsets may correspond to one or more subframe configurations that may be used for wireless communications at the particular frequency. In such a case, the UE may identify (e.g., based at least in part on information received from the base station), a subframe configuration to be used for the wireless communications and may identify the offset as an offset, of the multiple offsets associated with the frequency band, that is associated with the subframe configuration identified by the UE for the given direction of wireless communication.

In some aspects, an offset (e.g., identified in the offset information) may be based at least in part on at least one parameter. In some aspects, the offset information may be determined based at least in part on a calibration process associated with the at least one parameter, as described below. Additionally, or alternatively, the UE may determine (e.g., calculate, compute, and/or the like) the offset based at least in part on the at least one parameter).

The at least one parameter may include, for example, an amount of time available to tune a VCO back to the particular frequency from an offset frequency (e.g., in order to allow the Rx VCO to be used in association with receiving a DL communication after an UL transmission associated with the Tx VCO is completed, in order to allow the Tx VCO to be used in association with transmitting an UL communication after a DL communication, associated with the Rx VCO, is received). In some aspects, the amount of time available to tune a given VCO back to the particular frequency (e.g., from the offset frequency) may depend on a length of a period of time available to switch directions of wireless communication at the UE. As a particular example, the amount of time available to tune the Rx VCO back to the particular frequency may depend on a length of a period of time (e.g., a timing advance) available to switch from communicating in an UL direction to communicating in a DL direction. Thus, in some aspects, the at least one parameter may include a length of a timing advance associated with switching between the UL direction and the DL direction, such as a timing advance of at least approximately 20 microseconds. As another particular example, the amount of time available to tune the Tx VCO back to the particular frequency (e.g., as described below in connection with FIG. 8B) may depend on an amount of time available (e.g., a guard period) to switch from communicating in the DL direction to communicating in the UL direction. Thus, in some aspects, the at least one parameter may include a length of a guard period associated with switching between the DL direction and the UL direction, such as a guard period of at least approximately 45 microseconds.

As another example, the at least one parameter may include a frequency band of the particular frequency, where different offsets may be used for different frequency bands. As yet another example, the at least one parameter may include a VCO pulling effect of one VCO on another VCO (e.g., an amount of measured or predicted VCO pulling of the first VCO on the second VCO, an amount of measured or predicted VCO pulling of the second VCO on the first VCO), an amount of frequency effect between the first VCO and the second VCO, and/or the like.

As still another example, the at least one parameter may include a priority level associated with the Rx VCO and/or the Tx VCO. For example, VCOs may be assigned different levels of priority (e.g., high, medium, low; different numerical values; and/or the like). Here, a comparatively higher priority level may indicate that mitigating or preventing VCO pulling on the VCO with the comparatively higher priority level is to be prioritized over mitigating or preventing VCO pulling on the VCO with the comparatively lower priority level when determining the offset.

As still another example, in the case of UE operation in a CA mode, the at least one parameter may include a priority level associated with a particular carrier. For example, carriers may be assigned different levels of priority. Here, a particular carrier with a comparatively higher priority may be prioritized over another carrier with a comparatively lower priority (e.g., such that mitigating or preventing VCO pulling associated with the particular carrier is prioritized over mitigating or preventing VCO pulling associated with the other carrier). In some aspects, a priority level, associated with a given carrier may be based at least in part on a grant amount associated with the given carrier, a throughput associated with the given carrier, a data type (e.g., control, data, and/or the like) associated with the carrier, and/or the like. In a case where at least one VCO needs to be selected for tuning (e.g., when not all VCOs may be retuned) a particular VCO may be selected for tuning based at least in part on the priority level associated with a carrier associated with the particular VCO.

As yet another example, in the case of UE operation in an LTE with WiFi co-existence mode, the at least one parameter may include a priority level associated with the WLAN or the LTE network. For example, since WiFi communications use forward error correction (FEC) with rate control and LTE communications use HARQ (e.g., for retransmission), WiFi communications may need to be prioritized over LTE communications. Thus, priority levels may be assigned in order to mitigate or prevent VCO pulling in association with WiFi communications over LTE communications. As a particular example, when WiFi communications use carrier-sense multiple access with collision avoidance (CSMA-CA) for channel access, once a collision is detected, the UE may attempt a retransmission after a random back-off time. This (e.g., random) back off-time is calculated and known to the UE. In this example, an offset associated with tuning a Tx VCO associated with transmitting the WiFi communication may be based at least in part on the back-off timer value.

In some aspects, the offset information may be determined based at least in part on a calibration process associated with one or more frequency bands. For example, for a given frequency band, the calibration process may include tuning an Rx VCO to the particular frequency from various offsets (e.g., retuning to the particular frequency from different offset frequencies) while a Tx VCO operates at the particular frequency. Here, an offset, of the various offsets, that results in a lowest amount or a threshold amount of VCO pulling on the Tx VCO may be identified for the particular frequency. In some aspects, different retuning times may be tested for a given offset (e.g., such that different offsets may be used for different available retuning times, where retuning times may vary based at least in part on the subframe configuration). Alternatively, a shortest possible retuning time, among all possible subframe configurations, may be used to identify the offset (e.g., such that a single offset is used for each subframe configuration).

Continuing with the above example, the calibration process may include identifying an offset, of the various offsets, that results in a lowest amount of phase noise, an amount of phase noise that satisfies a phase noise threshold, a lowest signal-to-noise ratio (SNR), a SNR that satisfies a SNR threshold, and/or the like. In some aspects, in the case of UE operation at multiple frequency carriers (e.g., operation in a CA mode, operation in an LTE with WiFi co-existence mode, and/or the like), the calibration process may include operating another VCO at another frequency (e.g., associated with another carrier) and identifying the offset as an offset that results a lowest amount of interference associated with the other frequency, an amount of interference that satisfies an interference threshold, and/or the like. In some aspects, the offset may be identified based at least in part on a combination (e.g., an average, a weighted average) of two or more of the above-identified parameters and/or based at least in part on one or more other parameters.

In some aspects, the calibration process may be performed using multiple UEs, and a result of the calibration process may include the offset information. In some aspects, the calibration process may be an offline process, and the offset information may be provided to the UE. For example, in some aspects, the UE may receive the offset information (e.g., from the base station) based at least in part on connecting to the base station, and may store the offset information for use at a later time.

As shown by reference number 810, after determining the offset, the UE may tune the first VCO to the offset frequency. For example, the UE may tune the Rx VCO from the particular frequency to the offset frequency (e.g., such that the frequency of the Rx VCO differs from the particular frequency by the offset). As shown by reference number 815, the UE may communicate using the Tx VCO, where the Tx VCO is tuned to the particular frequency while the Rx VCO is tuned to the offset frequency. In some aspects, the Rx VCO being tuned to the offset frequency while the Tx VCO communicates using the particular frequency may mitigate or prevent VCO frequency disturbance on the Tx VCO, thereby improving performance of wireless communications associated with the UE.

As shown in FIG. 8B, and by reference number 820, the UE may tune the Rx VCO to the particular frequency (e.g., during a period of time to switch between a communication of an UL portion of a frame and a communication of a DL portion of a frame). For example, after the UE communicates using the Tx VCO, the UE may tune the Rx VCO to the particular frequency (e.g., such that the UE may communicate using the Rx VCO, as described below).

As shown by reference number 825, the UE may determine an offset frequency associated with the Tx VCO. In some aspects, the UE may determine the offset frequency in a manner similar to that described above in association with the Rx VCO. In some aspects, the offset frequency associated with the Tx VCO may be the same as or different from the offset frequency associated with the Rx VCO.

As shown by reference number 830, the UE may tune the Tx VCO to the offset frequency (e.g., during the period of time to switch between the communication of the UL portion of the frame and the communication of the DL portion of a frame). For example, the UE may tune the Tx VCO from the particular frequency to the offset frequency (e.g., such that the frequency of the Tx VCO differs from the particular frequency by the offset). As shown by reference number 835, the UE may communicate using the Rx VCO, where the Rx VCO is tuned to the particular frequency while the Tx VCO is tuned to the offset frequency. In some aspects, the Tx VCO being tuned to the offset frequency while the Rx VCO communicates using the particular frequency may mitigate or prevent VCO frequency disturbance on the Rx VCO, thereby improving performance of wireless communications associated with the UE.

In some aspects, after the UE completes the wireless communication associated with the Rx VCO, the UE may (e.g., during a period of time to switch between a communication of the DL portion of a frame and a communication of another UL portion of the frame) tune the Tx VCO to the particular frequency and may tune the Rx VCO to an offset frequency, in a manner similar to that described above, such that the UE may transmit a DL communication associated with the Tx VCO. In other words, the above-described process may be repeated by the UE in order to continue mitigation or prevention of VCO frequency disturbances while the UE transmits and receives wireless communications.

As indicated above, FIGS. 8A and 8B are provided as examples. Other examples are possible and may differ from what was described with respect to FIGS. 8A and 8B.

Figure 9:
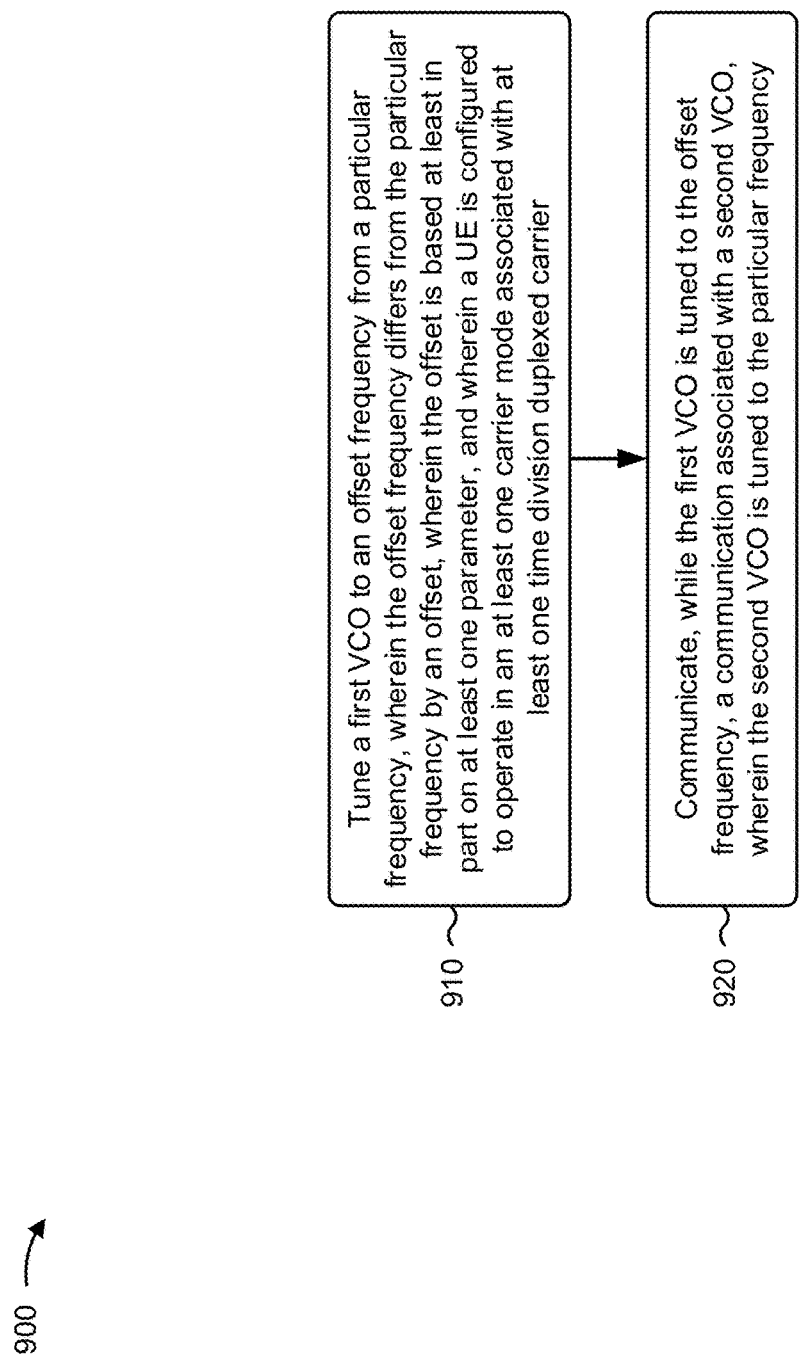
FIG. 9 is a diagram illustrating an example process performed, for example, by a user equipment, in accordance with various aspects of the present disclosure.

FIG. 9 is a diagram illustrating an example process 900 performed, for example, by a UE, in accordance with various aspects of the present disclosure. Example process 900 is an example where a UE (e.g., UE 145, 250) performs mitigation of VCO frequency disturbance.

As shown in FIG. 9, in some aspects, process 900 may include tuning a first VCO to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier (block 910). For example, the UE may tune a first VCO to an offset frequency from a particular frequency, wherein the offset frequency differs from the particular frequency by an offset, wherein the offset is based at least in part on at least one parameter, and wherein the UE is configured to operate in an at least one carrier mode associated with at least one time division duplexed carrier, as described above.

As further shown in FIG. 9, in some aspects, process 900 may include communicating, while the first VCO is tuned to the offset frequency, a communication associated with a second VCO, wherein the second VCO is tuned to the particular frequency (block 920). For example, the UE may communicate, while the first VCO is tuned to the offset frequency, a communication associated with a second VCO, wherein the second VCO is tuned to the particular frequency, as described above.

In some aspects, the second VCO is tuned to the particular frequency from an offset frequency.

In some aspects, the at least one parameter includes: an amount of time available to tune the first VCO to the particular frequency; a frequency band of the particular frequency; a VCO pulling effect of the first VCO on the second VCO; or a priority level associated with the first VCO or the second VCO.

In some aspects, the at least one parameter includes at least one of: an amount of time available to tune the first VCO to the offset frequency from the particular frequency; an amount of time available to tune the second VCO to the particular frequency; or an amount of frequency effect between the first VCO and the second VCO.

In some aspects, the offset is identified based at least in part on offset information stored by the UE, wherein the offset information includes information that identifies a set of offsets including the offset.

In some aspects, the first VCO and the second VCO are included in a same integrated circuit.

In some aspects, the first VCO and the second VCO are included in a single chip.

In some aspects, the first VCO is tuned to the particular frequency after the communication is communicated by the UE.

In some aspects, the second VCO is associated with transmitting communications on an uplink and the first VCO is associated with receiving communications on a downlink, and wherein at least one of: the first VCO is configured to be tuned to the offset frequency from the particular frequency based at least in part on a period of time to switch between a communication of a downlink portion of a frame and a communication of an uplink portion of a frame, or the second VCO is configured to be tuned to the particular frequency from an offset frequency based at least in part on a period of time to switch between a communication of a downlink portion of a frame and a communication of an uplink portion of a frame.

In some aspects, a length of the period of time is at least approximately 45 microseconds.

In some aspects, the period of time is based at least in part on a guard period between a downlink portion of a frame and an uplink portion of a frame.

In some aspects, the second VCO is associated with receiving communications on a downlink and the first VCO is associated with transmitting communications on an uplink, and wherein at least one of: the first VCO is configured to be tuned to the offset frequency from the particular frequency based at least in part on a timing advance, or the second VCO is configured to be tuned to the particular frequency from an offset frequency based at least in part on the timing advance.

In some aspects, a length of the timing advance is at least approximately 20 microseconds.

In some aspects, the at least one carrier mode is a carrier aggregation mode associated with associated with at least two carriers, wherein the at least two carriers include the at least one time division duplexed carrier and at least one of: at least one other time division duplexed carrier; or at least one frequency division duplexed carrier.

In some aspects, the at least one of the first VCO or second VCO are selected based at least in part on at least one of: an interference level associated with at least one of the at least two carriers; a grant amount associated with at least one of the at least two carriers; a throughput associated with at least one of the at least two carriers; or a data type associated with at least one of the at least two carriers.

In some aspects, the offset is based at least in part on having a long term evolution (LTE) network communication and a wireless local area network (WLAN) communication co-exist in the UE.

In some aspects, the at least one parameter includes at least one of: a priority level associated with the WLAN or the LTE network; or a back-off timer associated with the WLAN.

In some aspects, the offset is determined based at least in part on a calibration process, associated with a frequency band of the particular frequency, wherein the calibration process includes identifying the offset as a particular offset, of a plurality of offsets, that results in an amount of phase noise that satisfies a phase noise threshold and a signal-to-noise ratio (SNR) that satisfies a SNR threshold for a set of retuning times associated with retuning from the particular offset.

In some aspects, the offset is determined based at least in part on a calibration process associated with a frequency band of the particular frequency, wherein the calibration process includes identifying the offset as a particular offset, of a plurality of offsets, that results in an amount of phase noise that satisfies a phase noise threshold and an amount of interference, associated with another frequency band, that satisfies an interference threshold.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

FIG. 10 is a diagram illustrating an example process 1000 performed, for example, by a UE, in accordance with various aspects of the present disclosure. Example process 1000 is an example where a UE (e.g., UE 145, 250) performs mitigation of VCO frequency disturbance.

As shown in FIG. 10, in some aspects, process 1000 may include determining an offset associated with tuning a frequency of a first VCO from a particular frequency to an offset frequency, wherein the UE includes the first VCO and at least one second VCO, all of which are configured to communicate using the particular frequency, and wherein the UE is configured to operate in an at least one carrier mode associated with at least one time division duplexed carrier (block 1010). For example, the UE may determine an offset associated with tuning a frequency of a first VCO from a particular frequency to an offset frequency, wherein the UE includes the first VCO and at least one second VCO, all of which are configured to communicate using the particular frequency, and wherein the UE is configured to operate in an at least one carrier mode associated with at least one time division duplexed carrier, as described above.

As further shown in FIG. 10, in some aspects, process 1000 may include communicating, after tuning the frequency of the first VCO from the particular frequency to the offset frequency, a communication associated with one of the at least one second VCO, wherein the one of the at least one second VCO is tuned to the particular frequency, and wherein the offset is determined based at least in part on the communicating (block 1020). For example, the UE may communicate, after tuning the frequency of the first VCO from the particular frequency to the offset frequency, a communication associated with one of the at least one second VCO, wherein the one of the at least one second VCO is tuned to the particular frequency, and wherein the offset is determined based at least in part on the communicating, as described above.

In some aspects, the offset is based at least in part on at least one parameter.

In some aspects, the at least one second VCO is tuned to the particular frequency from an offset frequency.

In some aspects, the at least one parameter includes: an amount of time available to tune the first VCO to the particular frequency; a frequency band of the particular frequency; a VCO pulling effect of the first VCO on the at least one second VCO; or a priority level associated with the first VCO or the at least one second VCO.

In some aspects, the at least one parameter includes at least one of: an amount of time available to tune the first VCO to the offset frequency from the particular frequency; an amount of time available to tune the at least one second VCO to the particular frequency; or an amount of frequency effect between the first VCO and the at least one second VCO.

In some aspects, the offset is identified based at least in part on offset information stored by the UE, wherein the offset information includes information that identifies a set of offsets including the offset.

In some aspects, the first VCO and the at least one second VCO are included in a same integrated circuit.

In some aspects, the first VCO and the at least one second VCO are included in a single chip.

In some aspects, the first VCO is tuned to the particular frequency after the communication is communicated by the UE.

In some aspects, the at least one second VCO is associated with transmitting communications on an uplink and the first VCO is associated with receiving communications on a downlink, and wherein at least one of: the first VCO is configured to be tuned to the offset frequency from the particular frequency based at least in part on a period of time to switch between a communication of a downlink portion of a frame and a communication of an uplink portion of a frame, or the at least one second VCO is configured to be tuned to the particular frequency from an offset frequency based at least in part on a period of time to switch between a communication of a downlink portion of a frame and a communication of an uplink portion of a frame.

In some aspects, a length of the period of time is at least approximately 45 microseconds.

In some aspects, the period of time is based at least in part on a guard period between a downlink portion of a frame and an uplink portion of a frame.

In some aspects, the at least one second VCO is associated with receiving communications on a downlink and the first VCO is associated with transmitting communications on an uplink, and wherein at least one of: the first VCO is configured to be tuned to the offset frequency from the particular frequency based at least in part on a timing advance, or the at least one second VCO is configured to be tuned to the particular frequency from an offset frequency based at least in part on the timing advance.

In some aspects, a length of the timing advance is at least approximately 20 microseconds.

In some aspects, the at least one carrier mode is a carrier aggregation mode associated with associated with at least two carriers, wherein the at least two carriers include the at least one time division duplexed carrier and at least one of: at least one other time division duplexed carrier; or at least one frequency division duplexed carrier.

In some aspects, the first VCO or the at least one second VCO are selected based at least in part on at least one of: an interference level associated with at least one of the at least two carriers; a grant amount associated with at least one of the at least two carriers; a throughput associated with at least one of the at least two carriers; or a data type associated with at least one of the at least two carriers.

In some aspects, the offset is based at least in part on having an LTE network communication and a WLAN communication co-exist in the UE.

In some aspects, the at least one parameter includes at least one of: a priority level associated with the WLAN or the LTE network; or a back-off timer associated with the WLAN.

In some aspects, the offset is determined based at least in part on a calibration process associated with a frequency band of the particular frequency, wherein the calibration process includes identifying the offset as a particular offset, of a plurality of offsets, that results in an amount of phase noise that satisfies a phase noise threshold and a SNR that satisfies a SNR threshold for a set of retuning times associated with retuning from the particular offset.

In some aspects, the offset is determined based at least in part on a calibration process associated with a frequency band of the particular frequency, wherein the calibration process includes identifying the offset as a particular offset, of a plurality of offsets, that results in an amount of phase noise that satisfies a phase noise threshold and an amount of interference, associated with another frequency band, that satisfies an interference threshold.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication, comprising:
  tuning, by a user equipment (UE), a first voltage controlled oscillator (VCO) to an offset frequency from a particular frequency,
    wherein the offset frequency differs from the particular frequency by an offset,
      wherein the offset is based at least in part on:
        a length of a timing advance associated with switching from a communication in an uplink direction to a communication in a downlink direction, and
    wherein the UE is configured to operate in an at least one carrier mode associated with at least one time division duplexed carrier; and
  communicating, by the UE and while the first VCO is tuned to the offset frequency, a communication associated with a second VCO,
    wherein the second VCO is tuned to the particular frequency, and
    wherein the UE includes the first VCO and the second VCO.

2. The method of claim 1, wherein the second VCO is tuned to the particular frequency from an offset frequency.

3. The method of claim 1, wherein the offset is based on at least one of:
  a frequency band of the particular frequency;
  a VCO pulling effect of the first VCO on the second VCO; or
  a priority level associated with the first VCO or the second VCO.

4. The method of claim 1, wherein the offset is based on at least one of:
  an amount of time available to tune the first VCO to the offset frequency from the particular frequency;
  an amount of time available to tune the second VCO to the particular frequency; or
  an amount of frequency effect between the first VCO and the second VCO.

5. The method of claim 1, wherein the offset is identified based at least in part on offset information stored by the UE, wherein the offset information includes information that identifies a set of offsets including the offset.

6. The method of claim 1, wherein the first VCO and the second VCO are included in a same integrated circuit.

7. The method of claim 1, wherein the first VCO and the second VCO are included in a single chip.

8. The method of claim 1, wherein the first VCO is tuned to the particular frequency after the communication is communicated by the UE.

9. The method of claim 1, wherein the second VCO is associated with transmitting communications on an uplink and the first VCO is associated with receiving communications on a downlink, and
  wherein at least one of:
    the first VCO is configured to be tuned to the offset frequency from the particular frequency based at least in part on a period of time to switch between a communication of a downlink portion of a frame and a communication of an uplink portion of a frame, or
    the second VCO is configured to be tuned to the particular frequency from an offset frequency based at least in part on a period of time to switch between a communication of a downlink portion of a frame and a communication of an uplink portion of a frame.

10. The method of claim 9, wherein a length of the period of time is at least approximately 45 microseconds.

11. The method of claim 1, wherein the offset is based at least in part on a length of a guard period between a downlink portion of a frame and an uplink portion of the frame.

12. The method of claim 1, wherein the second VCO is associated with receiving communications on a downlink and the first VCO is associated with transmitting communications on an uplink, and
  wherein at least one of:
    the first VCO is configured to be tuned to the offset frequency from the particular frequency based at least in part on the length of the timing advance, or
    the second VCO is configured to be tuned to the particular frequency from an offset frequency based at least in part on the length of the timing advance.

13. The method of claim 12, wherein the length of the timing advance is at least approximately 20 microseconds.

14. The method of claim 1, wherein the at least one carrier mode is a carrier aggregation mode associated with at least two carriers, wherein the at least two carriers include the at least one time division duplexed carrier and at least one of:
  at least one other time division duplexed carrier; or
  at least one frequency division duplexed carrier.

15. The method of claim 14, wherein the at least one of the first VCO or second VCO are selected based at least in part on at least one of:
  an interference level associated with at least one of the at least two carriers,
  a grant amount associated with at least one of the at least two carriers;
  a throughput associated with at least one of the at least two carriers; or
  a data type associated with at least one of the at least two carriers.

16. The method of claim 1, wherein the offset is based at least in part on having a long term evolution (LTE) network communication and a wireless local area network (WLAN) communication co-exist in the UE.

17. The method of claim 16, wherein the offset is based on at least one of:
    a priority level associated with the WLAN or the LTE network; or
    a back-off timer associated with the WLAN.

18. The method of claim 1, wherein the offset is determined based at least in part on a calibration process associated with a frequency band of the particular frequency,
    wherein the calibration process includes identifying the offset as a particular offset, of a plurality of offsets, that results in an amount of phase noise that satisfies a phase noise threshold and a signal-to-noise ratio (SNR) that satisfies a SNR threshold for a set of retuning times associated with retuning from the particular offset.

19. The method of claim 1, wherein the offset is determined based at least in part on a calibration process associated with a frequency band of the particular frequency,
    wherein the calibration process includes identifying the offset as a particular offset, of a plurality of offsets, that results in an amount of phase noise that satisfies a phase noise threshold and an amount of interference, associated with another frequency band, that satisfies an interference threshold.

20. A user equipment (UE), comprising:
    a first voltage controlled oscillator (VCO);
    a second VCO;
    a memory; and
    one or more processors, operatively coupled to the memory, the one or more processors configured to:
        tune the first VCO to an offset frequency from a particular frequency,
            wherein the offset frequency differs from the particular frequency by an offset,
            wherein the offset is based at least in part on:
                a length of a timing advance associated with switching from a communication in an uplink direction to a communication in a downlink direction, and
            wherein the UE is configured to operate in an at least one carrier mode associated with at least one time division duplexed carrier; and
        communicate, while the first VCO is tuned to the offset frequency, a communication associated with the second VCO,
            wherein the second VCO is tuned to the particular frequency.

21. The UE of claim 20, wherein the second VCO is tuned to the particular frequency from an offset frequency.

22. The UE of claim 20, wherein the offset is based on at least one of:
    a frequency band of the particular frequency;
    a VCO pulling effect of the first VCO on the second VCO; or
    a priority level associated with the first VCO or the second VCO.

23. The UE of claim 20, wherein the offset is based on at least one of:
    an amount of time available to tune the first VCO to the offset frequency from the particular frequency;
    an amount of time available to tune the second VCO to the particular frequency; or
    an amount of frequency effect between the first VCO and the second VCO.

24. The UE of claim 20, wherein the first VCO and the second VCO are included in a single chip.

25. A non-transitory computer-readable medium storing one or more instructions for wireless communication, the one or more instructions comprising:
    one or more instructions that, when executed by one or more processors of a user equipment (UE), cause the one or more processors to:
        tune a first voltage controlled oscillator (VCO) to an offset frequency from a particular frequency,
            wherein the offset frequency differs from the particular frequency by an offset,
            wherein the offset is based at least in part on:
                a length of a timing advance associated with switching from a communication in an uplink direction to a communication in a downlink direction, and
            wherein the UE is configured to operate in an at least one carrier mode associated with at least one time division duplexed carrier; and
        communicate, while the first VCO is tuned to the offset frequency, a communication associated with a second VCO,
            wherein the second VCO is tuned to the particular frequency, and
            wherein the UE includes the first VCO and the second VCO.

26. The non-transitory computer-readable medium of claim 25, wherein the second VCO is tuned to the particular frequency from an offset frequency.

27. The non-transitory computer-readable medium of claim 25, wherein the offset is based on at least one of:
    a frequency band of the particular frequency;
    a VCO pulling effect of the first VCO on the second VCO; or
    a priority level associated with the first VCO or the second VCO.

28. The non-transitory computer-readable medium of claim 25, wherein the offset is based on at least one of:
    an amount of time available to tune the first VCO to the offset frequency from the particular frequency;
    an amount of time available to tune the second VCO to the particular frequency; or
    an amount of frequency effect between the first VCO and the second VCO.

29. A method of wireless communication, comprising:
    determining, by a user equipment (UE), an offset associated with tuning a frequency of a first voltage controlled oscillator (VCO) from a particular frequency to an offset frequency, and
        wherein the UE includes the first VCO and at least one second VCO, all of which are configured to communicate using the particular frequency,
        wherein the UE is configured to operate in an at least one carrier mode associated with at least one time division duplexed carrier, and
        wherein the offset is determined based at least in part on:
            a length of a timing advance associated with switching from a communication in an uplink direction to a communication in a downlink direction; and
    communicating, by the UE and after tuning the frequency of the first VCO from the particular frequency to the offset frequency, a communication associated with one of the at least one second VCO,
        wherein the one of the at least one second VCO is tuned to the particular frequency, and
        wherein the UE includes the first VCO and the second VCO.

30. The method of claim 29, wherein the one of the at least one second VCO is tuned to the particular frequency from an offset frequency.

\* \* \* \* \*